(12) United States Patent
Dong et al.

(10) Patent No.: US 12,056,355 B2
(45) Date of Patent: Aug. 6, 2024

(54) MEMORY DEVICE, A MEMORY SYSTEM AND AN OPERATION METHOD

(71) Applicant: YANGTZE MEMORY TECHNOLOGIES CO., LTD., Wuhan (CN)

(72) Inventors: Zhipeng Dong, Wuhan (CN); Ying Huang, Wuhan (CN); Manxi Wang, Wuhan (CN); Hongtao Liu, Wuhan (CN); Ling Chu, Wuhan (CN); Ke Liang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 44 days.

(21) Appl. No.: 17/940,652

(22) Filed: Sep. 8, 2022

(65) Prior Publication Data
US 2023/0342029 A1    Oct. 26, 2023

(51) Int. Cl.
*G06F 3/06* (2006.01)

(52) U.S. Cl.
CPC .......... *G06F 3/0608* (2013.01); *G06F 3/0653* (2013.01); *G06F 3/0679* (2013.01)

(58) Field of Classification Search
CPC ..... G06F 3/0608; G06F 3/0653; G06F 3/0679
See application file for complete search history.

(56) References Cited

U.S. PATENT DOCUMENTS

| 10,790,035 B2 * | 9/2020 | Choi ............... G11C 29/021 |
| 2006/0120136 A1 * | 6/2006 | Dennison ........... G11C 11/16 365/148 |
| 2011/0085385 A1 * | 4/2011 | Park ............ G11C 11/5628 365/185.2 |
| 2015/0348616 A1 | 12/2015 | Chiu et al. |
| 2016/0141011 A1 * | 5/2016 | Lee ................ G11C 16/14 365/201 |

FOREIGN PATENT DOCUMENTS

TW    201924029 A    6/2019

* cited by examiner

*Primary Examiner* — Baboucarr Faal
(74) *Attorney, Agent, or Firm* — BAYES PLLC

(57) ABSTRACT

This disclosure provides a memory device, a memory system, and an operation method. The memory device includes a memory array having a plurality of memory blocks and a control circuit coupled to the memory array and used to control the memory array. The control circuit is configured to determine a first average value of threshold voltages of bottom dummy cells in an unused memory block, determine a difference value between the first average value and a first reference value, and judge based on the difference value when bottom dummy cells in the memory block are to be programmed so that the first average value reaches a first threshold.

20 Claims, 21 Drawing Sheets

MEMORY DEVICE, A MEMORY SYSTEM AND AN OPERATION METHOD

CROSS-REFERENCE TO RELATED APPLICATION

The present application claims the benefit of priority to China Patent Application No. CN 202210427276.2, filed on Apr. 21, 2022, the content of which is incorporated herein by reference in its entirety.

TECHNICAL FIELD

The present disclosure relates to the field of memory technologies, and in particular, to a memory device, a memory system, and an operation method.

BACKGROUND

Non-volatile memory has been widely used in electronic devices in various fields. Flash memory is one of the most widely used non-volatile memories that can be electrically erased and reprogrammed. A flash memory can comprise memories of both NOR and NAND architectures, wherein the threshold voltage for each memory cell in the flash memory is changed to a required level for achieving various operations such as reading, programming, and erasing. When operating the flash memory, an erasing operation can be performed at a block level, a programming operation can be performed at a page level, and a reading operation can be performed at a memory cell level. At present, a NAND flash memory with a planar structure has been widely used. In order to further increase the storage capacity of a flash memory and reduce the storage cost per bit, a three-dimensional (3D) NAND memory is proposed, the structure of which comprises: a substrate; a stack structure provided on the substrate; several channel holes running through the stack structure; a storage structure located in the channel hole, the storage structure comprising a charge storage layer located on the sidewall surface of the channel hole and a channel layer located on the sidewall surface of the charge storage layer, the position where the storage structure in each channel hole intersects with each control gate corresponds to one memory cell. In the 3D NAND under this structure, when programming a certain layer of memory cells in a certain channel hole, there exists a program disturb of a hot carrier injection (HCI) type brought to memory cells in other layers of other channel holes.

SUMMARY

In view of this, the main purpose of the present disclosure is to provide a memory device, a memory system, and an operation method to reduce HCI-type program disturb when 3D NAND performs programming.

In a first aspect, the present disclosure provides a memory device including:
a memory array, the memory array comprises a plurality of memory blocks, each memory block includes a plurality of memory cell strings, and each memory cell string includes a top dummy cell, a plurality of memory cells, and a bottom dummy cell connected in series; wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line; and
a control circuit coupled to the memory array and used to control the memory array,
wherein the control circuit is configured to:
determine a first average value of threshold voltages of bottom dummy cells in an unused memory block;
determine a difference value between the first average value and a first reference value;
judge based on the difference value when bottom dummy cells in the memory block are to be programmed so that the first average value reaches a first threshold, wherein the first threshold is used to make a potential difference between an edge word line and an adjacent non-edge word line to be reduced when programming a memory cell coupled to a selected non-edge word line, the edge word line is at least one word line of the plurality of word lines which is adjacent to the source line, the non-edge word line is a word line of the plurality of word lines except for the edge word line, and the selected non-edge word line is not adjacent to the edge word line.

In a second aspect, the present disclosure further provides a method for programming a memory device, the memory device includes a memory array, the memory array comprises a plurality of memory blocks, each memory block includes a plurality of memory cell strings, and each memory cell string includes a top dummy cell, a plurality of memory cells, and a bottom dummy cell connected in series; wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line; the method comprises:
determining a first average value of threshold voltages of bottom dummy cells in an unused memory block;
determining a difference value between the first average value and a first reference value;
judging based on the difference value when bottom dummy cells in the memory block are to be programmed so that the first average value reaches a first threshold, wherein the first threshold is used to make a potential difference between an edge word line and an adjacent non-edge word line to be reduced when programming a memory cell in a selected memory cell string and coupled to a selected non-edge word line, the edge word line is at least one word line of the plurality of word lines which is adjacent to the source line, the non-edge word line is a word line of the plurality of word lines except for the edge word line, and the selected non-edge word line is not adjacent to the edge word line.

In a third aspect, an implementation of the present disclosure further provides a memory system comprising:
a memory device, including:
a memory array, the memory array comprises a plurality of memory blocks, each memory block includes a plurality of memory cell strings, and each memory cell string includes a top dummy cell, a plurality of memory cells, and a bottom dummy cell connected in series; wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line;

a control circuit coupled to the memory array and used to control the memory array, wherein the control circuit is configured to: determine a first average value of threshold voltages of bottom dummy cells in an unused memory block; determine a difference value between the first average value and a first reference value; judge based on the difference value when bottom dummy cells in the memory block are to be programmed so that the first average value reaches a first threshold; wherein the first threshold is used to make a potential difference between an edge word line and an adjacent non-edge word line to be reduced when programming a memory cell coupled to a selected non-edge word line, the edge word line is at least one word line of the plurality of word lines which is adjacent to the source line, the non-edge word line is a word line of the plurality of word lines except for the edge word line, and the selected non-edge word line is not adjacent to the edge word line; and a memory controller coupled to the memory device, wherein the memory controller is configured to control the memory device.

Implementations of the present disclosure provide a memory device, a memory system, and an operation method, wherein the memory device includes: a memory array, the memory array comprises a plurality of memory blocks, each memory block includes a plurality of memory cell strings, and each memory cell string includes a top dummy cell, a plurality of memory cells, and a bottom dummy cell connected in series, wherein the top dummy cell is connected to a bit line, the bottom dummy cell is connected to a source line, the bottom dummy cell is coupled with a bottom dummy word line, the plurality of memory cells are respectively coupled with a plurality of word lines, the top dummy cell is coupled with a top dummy word line; and a control circuit coupled to the memory array and used to control the memory array, wherein the control circuit is configured to: determine a first average value of threshold voltages of bottom dummy cells in an unused memory block; determine a difference value between the first average value and a first reference value; judge based on the difference value when bottom dummy cells in the memory block are to be programmed so that the first average value reaches a first threshold, wherein the first threshold is used to make a potential difference between an edge word line and an adjacent non-edge word line to be reduced when programming a memory cell coupled to a selected non-edge word line, the edge word line is at least one word line of the plurality of word lines which is adjacent to the source line, the non-edge word line is a word line of the plurality of word lines except for the edge word line, and the selected non-edge word line is not adjacent to the edge word line. In the memory device, system and operation method provided according to the implementations of the present disclosure, by comparing the threshold voltage of the bottom dummy cell coupled to the bottom dummy word line in the memory device with a reference value, it is judged if the threshold voltages of the bottom dummy cells coupled to the bottom dummy word lines in the memory device need to be programmed to a target value (i.e., the first threshold) at which the potential difference between an edge word line (e.g., the word line WL1) and a non-edge word line (e.g., the word line WL2) which are adjacent is reduced, thereby reducing HCI type disturb on an edge word line (e.g., the word line WL1) during programming of a non-edge word line (e.g., the word line WL3), thus reducing the influence on read window margin.

BRIEF DESCRIPTION OF DRAWINGS

In the drawings, which are not necessarily drawn according to scale, the same reference numbers may describe similar components in different views. The same numbers with different letter suffixes may represent different instances of similar components. The accompanying drawings generally illustrate, by way of example and not limitation, various implementations discussed in this document.

DETAILED DESCRIPTION

Figure 1:
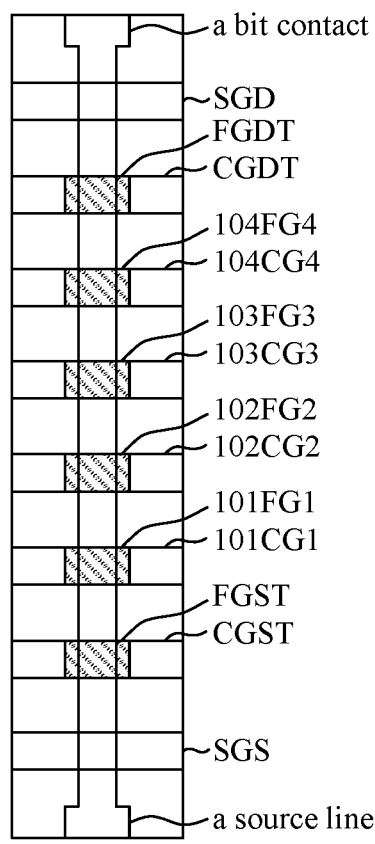
FIG. 1 is a schematic diagram of a structure of a NAND string provided according to an implementation of the present disclosure.

Various implementations of the present disclosure are described in more detail below with reference to the accompanying drawings. Other implementations as variations of any of the disclosed implementations may be formed by variously configuring or arranging the elements and features of the present disclosure. Therefore, the present disclosure is not limited to the implementations set forth herein. Rather, the described implementations are provided so that the present disclosure will be thorough and complete, and will fully convey the scope of the present disclosure to those skilled in the art to which the present disclosure pertains. It should be noted that references to "an implementation," "another implementation," etc. do not necessarily mean only one implementation, and that different references to any such phrases are not necessarily with respect to the same implementation. It will be understood that, although the terms "first," "second," "third," etc. may be used herein to identify various elements, these elements are not limited by these terms. These terms are used to distinguish one element from another element that has the same or similar name. Thus, a first element in one implementation could also be termed a second or third element in another implementation without departing from the spirit and scope of the present disclosure.

The drawings are not necessarily drawn to scale and, in some instances, may be exaggerated to clearly illustrate features of the implementations. When an element is referred to as being connected or jointed to another element, it will be understood that the former may be directly connected or jointed to the latter or may be electrically connected or jointed to the latter via one or more intervening elements therebetween. In addition, it will also be understood that when an element is referred to as being "between" two elements, the element can be the only element between the two elements, or one or more intervening elements may also be present.

The terminology used herein is for the purpose of describing particular implementations only and is not intended to limit the present disclosure. The singular as used herein is intended to comprise the plural unless the context clearly dictates otherwise. Unless otherwise indicated or clearly understood as singular form from the context, the article "a" and/or "an" used in the present disclosure and the appended claims shall be collectively interpreted to mean "one or more". It is to be further understood that the terms "comprise", "comprised", "include" and "included" as used herein designate the presence of stated elements and do not preclude the presence or addition of one or more other elements. As used herein, the term "and/or" comprises any and all combinations of one or more of the associated listed items. Unless otherwise defined, all terms comprising technical and scientific techniques used herein have the same meaning as commonly understood in view of the present disclosure by one of ordinary skill in the art to which the present disclosure belongs. It should be further understood that, unless it is clearly defined in the present disclosure, those defined in common dictionaries, for example, should be interpreted as having meanings consistent with their meanings in the context of the disclosure and related technologies, and should not be interpreted in an idealized or overly formal manner.

In the following description, numerous specific details are set forth in order to provide a thorough understanding of the present disclosure, and the present disclosure may be practiced without some or all of these specific details. In other instances, well-known process structures and/or processes have not been described in detail so as not to unnecessarily obscure the present disclosure. It is also to be understood that in some cases, unless otherwise indicated, it would be obvious to those skilled in the relevant art that features or elements described in relation to one implementation may be used alone or in combination with other features or elements of another implementation. Hereinafter, various implementations of the present disclosure are described in detail with reference to the accompanying drawings. The following description focuses on details to facilitate understanding of implementations of the present disclosure. Well-known technical details may be omitted so as not to obscure features and aspects of the present disclosure.

The present disclosure will be described in further detail below with reference to the accompanying drawings and specific implementations.

Figure 2:
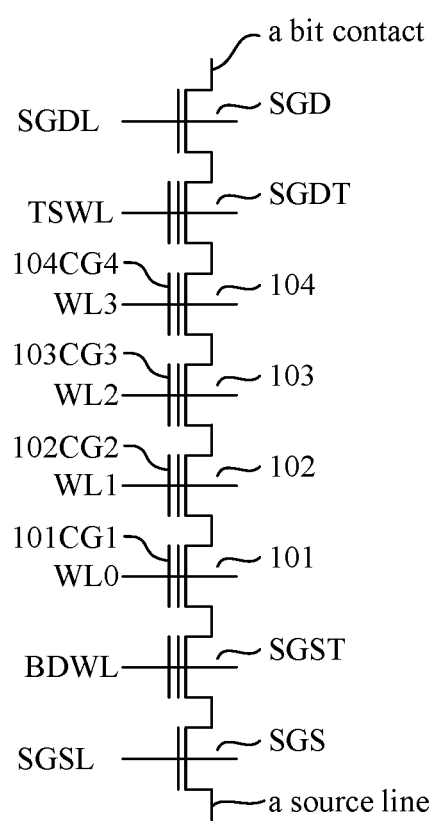
FIG. 2 is an equivalent circuit diagram of a NAND string according to an implementation of the present disclosure.

FIG. 1 is a schematic diagram of a structure of a NAND string provided according to an implementation of the present disclosure; FIG. 2 is an equivalent circuit diagram of the NAND string shown in FIG. 1. In a flash memory system of NAND structure, a plurality of transistors are arranged in series and sandwiched between two select gates (source gate and drain gate), and the two select gates and the transistors in series are called a NAND string. The NAND string shown in FIGS. 1 and 2 comprises a top select gate SGD (on the drain side), a bottom select gate SGS (on the source side), a top dummy transistor SGDT, four transistors 101-104, and a bottom dummy transistor SGST sandwiched between the top select gate SGD and the bottom select gate SGS. Thereinto, the top select gate SGD connects the NAND string to a bit line through the bit line contact; the top select gate SGD is controlled by applying an appropriate voltage to a top select gate line SGDL. The bottom select gate SGS connects the NAND string to a source line; the bottom select gate SGS is controlled by applying an appropriate voltage to a bottom select gate line SGSL. Each of the top dummy transistor SGDT, the four transistors 101-104 and the bottom dummy transistor SGST includes a control gate and a floating gate, for example, the top dummy transistor SGDT comprises a control gate CGDT and a floating gate FGDT, the transistor 101 includes a control gate 101CG1 and a floating gate 101FG1, the transistor 102 includes a control gate 102CG2 and a floating gate 102FG2, the transistor 103 includes a control gate 103CG3 and a floating gate 103FG3, the transistor 104 includes a control gate 104CG4 and a floating gate 104FG4, the bottom dummy transistor SGST comprises a control gate CGST and a floating gate FGST. The control gate CGST is connected with the bottom dummy word line BDWL, the control gates 101CG1-104CG4 are connected with the word lines WL0-WL3 respectively, and the control gate CGDT is connected with the top dummy word line TSWL.

It should be noted that FIG. 1 and FIG. 2 are only to exemplarily show four memory cells (transistors 101-104) used for reading and writing operations and two dummy memory cells (a top dummy transistor SGDT and a bottom dummy transistor SGST) used for reading and writing tests in the NAND string. In practical applications, the NAND string may include 8, 16, 32, 64, 128 memory cells, etc., that is, the number of memory cells or dummy memory cells in the NAND string does not limit the scope of the present disclosure. Furthermore, a typical structure of a flash memory system using a NAND structure includes a plurality of NAND strings. Each NAND string is connected to a source line through a bottom select gate SGS controlled by a bottom select gate line SGSL and to a corresponding bit line through a top select gate SGD controlled by a top select gate line SGDL. Each bit line and a corresponding NAND string(s) connected to the bit line via a bit line contact form a column in an array of memory cells. The bit line is shared by a plurality of NAND strings. Typically, a bit line extends on top of the NAND string in a direction perpendicular to a word line, and is connected to one or more sense amplifiers. It should be understood that the present disclosure only uses the structures in FIG. 1 and FIG. 2 to exemplarily illustrate the NAND string structure. In practical applications, a trap charge layer is not necessarily a floating gate, but may also be a trap nitride layer, non-conductive dielectric materials, and the like.

Figure 3:
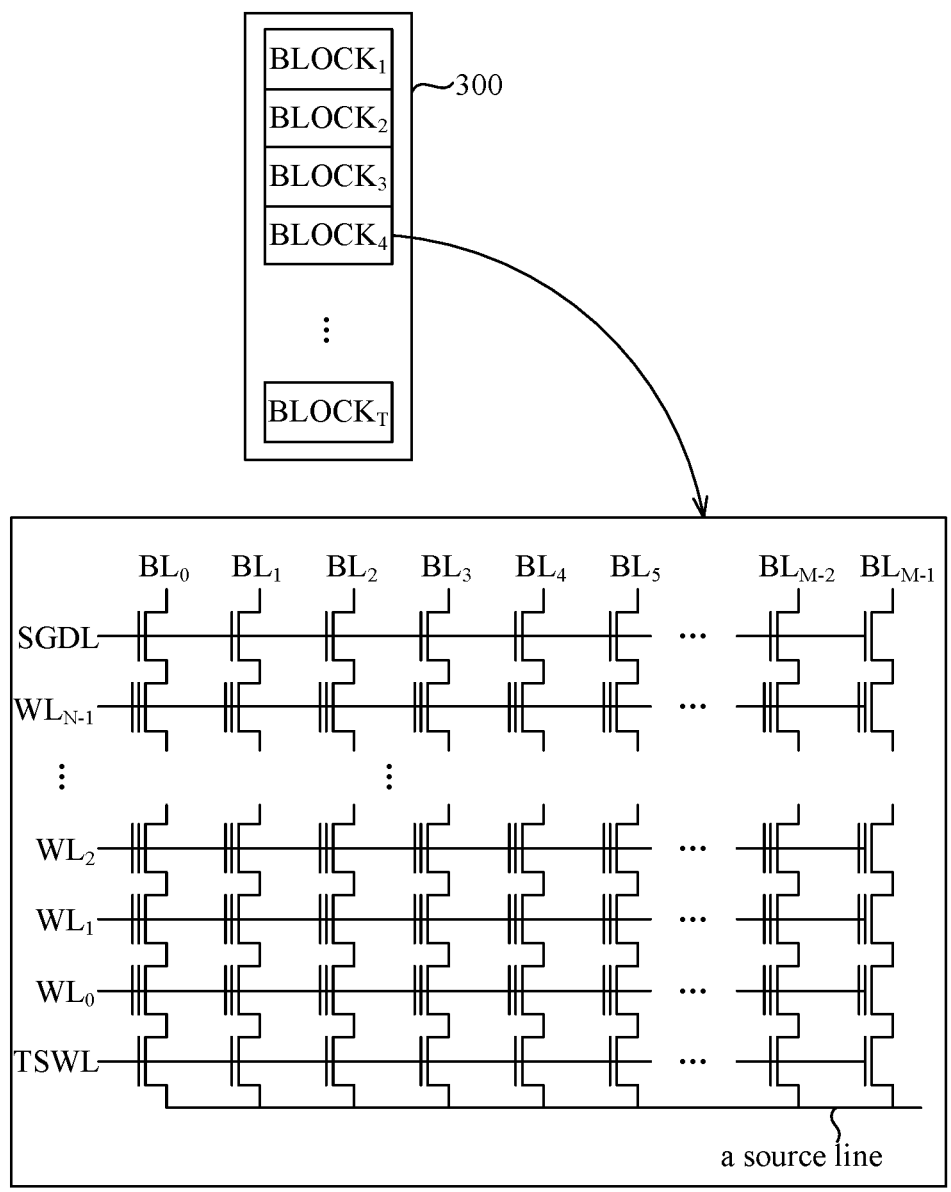
FIG. 3 is a schematic diagram of an array structure of a memory cell provided according to an implementation of the present disclosure.

During a practical application process, the memory array in the memory device is a memory array with a plurality of memory blocks and formed through a suitable layout of the NAND string shown in FIG. 1 and FIG. 2, and an exemplary structure thereof is shown in FIG. 3. The memory array 300 is a memory array having a plurality of memory blocks $BLOCK_1$-$BLOCK_T$, where T is a positive integer and generally a larger number. Each memory block includes a set of NAND strings accessed via bit lines $BL_0$-$BL_{M-1}$ and a set of common word lines $WL_0$-$WL_{N-1}$, where M, N are both integers more than 1. One end of the NAND string is connected to a corresponding bit line via the top select gate SGD (controlled by the top select gate line SGDL) and the other end is connected to the source line via the bottom select gate SGS (controlled by bottom select gate line SGSL). Each memory block is divided into a plurality of pages. In some other implementations, a memory block is a unit of erasing and a page is a unit of programming. In other implementations, other units of erasing and programming may also be used. In an example, the physical structure of the memory cells in the memory array shown in FIG. 3 does not limit the scope of the present disclosure.

In the present disclosure, the memory array shown in FIG. 3 can be arranged in a 3D QLC structure. It should be noted that other structural arrangements do not limit the scope of the present disclosure.

Figure 4:
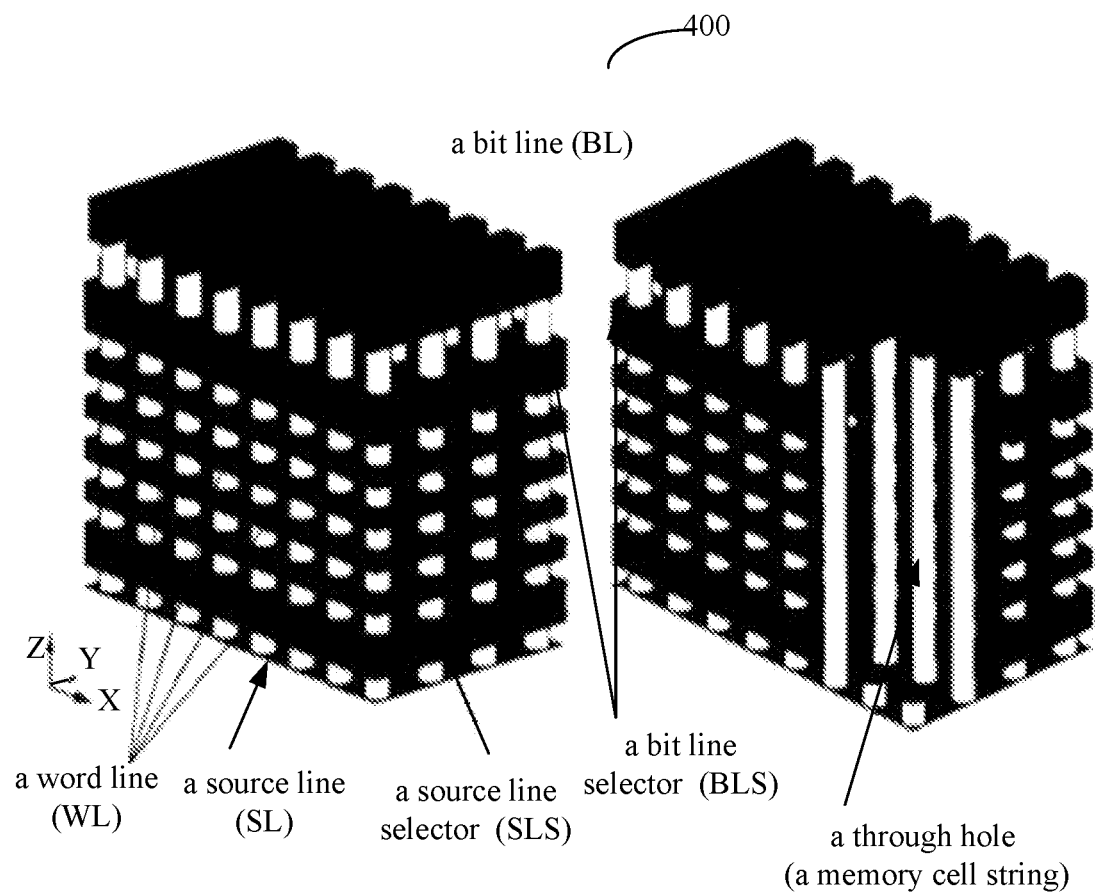
FIG. 4 is a schematic diagram of a structure of a single-block three-dimensional memory array provided according to an implementation of the present disclosure.

For the structure of a certain memory block, as shown in FIG. 4, it shows a schematic diagram of a structure of a three-dimensional memory array with a single memory block provided according to an implementation of the present disclosure. Referring to FIG. 4, a memory block 400 includes a plurality of layers stacked over a substrate (not shown) and parallel to a surface of the substrate, and FIG. 4 shows four word lines (WLs) on four layers, which may be denoted as WL0 to WL3. The memory block 400 is also arranged with a plurality of through holes perpendicular to the word lines. The intersection of one word line and one through hole forms one memory cell, so one through hole can also be called a memory cell string. It should be understood by those skilled in the art that the number of word lines and the number of memory cell strings in the memory block 400 are not limited to specific values. For example, the memory block 400 may comprise 64 word lines, and the 64 word lines intersect with one memory cell string to form 64 memory cells along the memory cell string. For another example, the number of memory cell strings comprised in the memory block 400 may be in the order of one hundred thousand, one million, or even greater, and one word line comprises several millions of memory cells formed by intersecting with, for example, several millions of memory cell strings. The memory cells in the memory block 400 can be a single-level memory cell or a multi-level memory cell, wherein the single-level memory cell may be a single-level cell (SLC) capable of storing 1 bit (bit); the multi-level memory cell may be a multi-level cell (MLC) capable of storing 2 bits, a tri-level cell (TLC) capable of storing 3 bits, a quad-level cell (QLC) capable of storing 4 bits, and a penta-level cell (PLC) capable of storing 5 bits.

As shown in FIG. 4, the memory block 400 further comprises a bit line (BL), a bit line selector (BLS, can also be referred to as a top select gate line SGDL), a source line (SL), a source selector (SLS, can also be referred to as a bottom select gate line SGSL), and these circuit lines and word lines (WL) together can achieve addressing of any memory cell in the memory block 400.

Figure 5A:
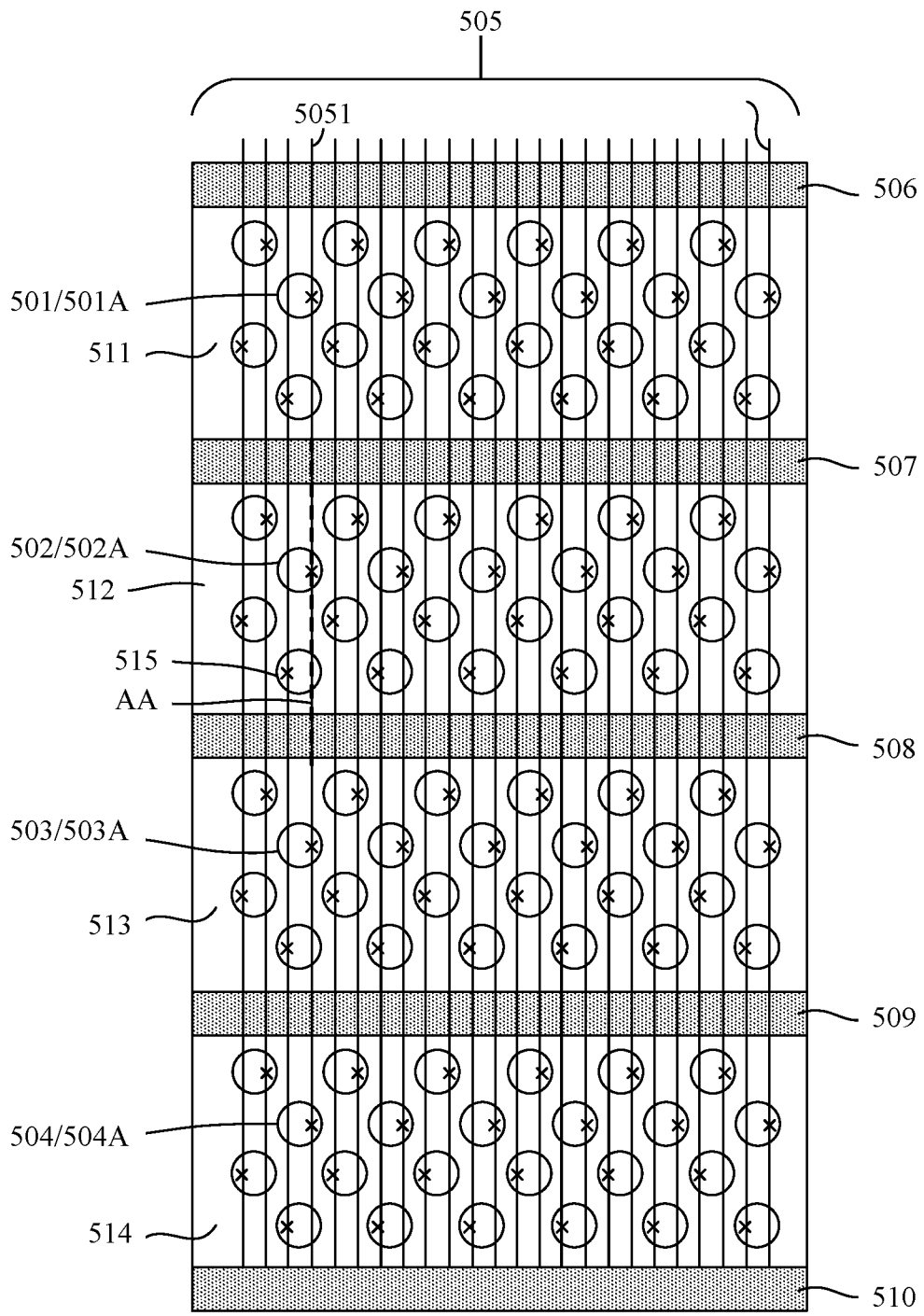
FIG. 5A to FIG. 5E are schematic diagrams of related structures of a three-dimensional NAND provided according to an implementation of the present disclosure.

FIG. 5A to FIG. 5E depict a top view, a cross-sectional view, etc. corresponding to a portion of the three-dimensional (3D) NAND structure of FIG. 4. FIG. 5A is a top view depicting a portion of the three-dimensional (3D) NAND structure of FIG. 4 provided according to an implementation of the present disclosure. It should be noted that a plurality of circles in FIG. 5A represent vertical columns, and each vertical column comprises a plurality of select transistors (also referred to as select gates or choose gates) and a plurality of memory cells. In an implementation, each vertical column implements one NAND string, e.g., FIG. 5A depicts vertical columns 501, 502, 503, and 504, wherein the vertical column 501 implements NAND string 501A. The vertical column 502 implements NAND string 502A. The vertical column 503 implements NAND string 503A. The vertical column 504 implements NAND string 504A. It should be understood that FIG. 5A shows only a portion of the top view of the memory block 400, so the memory block 400 should have more vertical columns than that shown in FIG. 5A. FIG. 5A also depicts a set of bit lines 505. FIG. 5A shows only twenty-four bit lines, since only a portion of the memory block 400 is shown. It should be understood that there should be more than twenty-four bit lines connected to the vertical columns of the memory block 400. Each circle representing a vertical column has an "x" to indicate that it is connected with a bit line, e.g., the bit line 5051 is connected to vertical columns 501, 502, 503, and 504. The memory block depicted in FIG. 5A also comprises a set of local interconnects 506, 507, 508, 509, and 510, and the set of local interconnects connect the various layers to the source lines below the vertical columns. Local interconnects 506, 507, 508, 509, and 510 are also used to divide each layer of the memory block 400 into four regions, for example, the top layer depicted in FIG. 5A is divided into regions 511, 512, 513, and 514, which are called fingers. In the layers that implement the memory blocks of memory cells, these four regions are called word line fingers, and they are separated by local interconnects. In an implementation, the word line fingers on a common level of a memory block are connected together to form a single word line. In another implementation, the word line fingers on the same level are not connected together. In an exemplary implementation, the bit lines are connected only to one vertical column in each of regions 511, 512, 513, and 514. In this implementation, each memory block has sixteen rows of active columns, and each bit line is connected to four rows in each memory block. In an implementation, all four rows connected to a common bit line are connected to the same word line (via different word line fingers on the same level and connected together); therefore, the memory system uses a source select line and a drain select line to select one (or another subset) of the four rows to perform memory operations (programming, verifying, reading, and/or erasing).

It should be noted that although FIG. 5A shows that each region has four vertical rows of vertical columns in one memory block, and four regions have sixteen vertical rows of vertical columns, these exact numbers are exemplary implementations. Other implementations may comprise more or fewer regions per block, more or fewer rows of vertical columns per region, and more or fewer rows of vertical columns per block. In addition, FIG. 5A also shows that the vertical columns are staggered. In other implementations, different staggered patterns may be used. In some implementations, the vertical columns are not staggered.

Figure 5B:
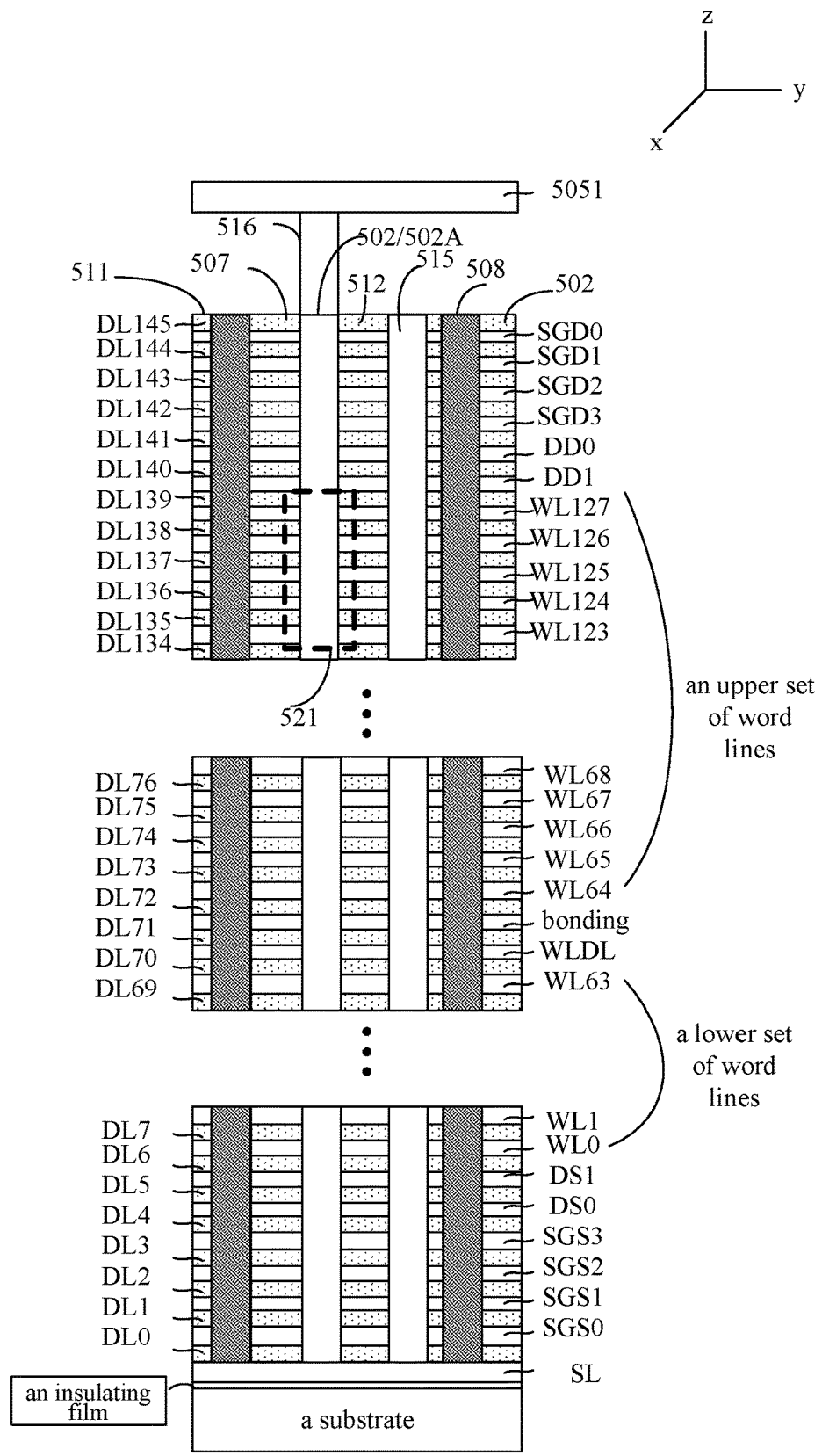

FIG. 5B shows a cross-sectional view along line AA of FIG. 5A. The cross-sectional view cuts through a vertical column 502 and a vertical column 515 adjacent to the vertical column 502 and a region 512 (see FIG. 5A in particular). FIG. 5B shows that the memory block 400 comprises: four drain side select layers SGD0, SGD1, SGD2 and SGD3; four source side select layers SGS0, SGS1, SGS2 and SGS3; six dummy word line layers TSWL0, TSWL1, BDWL0, BDWL1, WLDL, WLDU; and 128 data word line layers WLL0 to WLL127, these data word line layers being used to connect to data memory cells. Other implementations may implement more or less than four drain side select layers, more or less than four source side select layers, more or less than six dummy word line layers, and more or less than 128 word line layers. The vertical columns 502 and 515 are depicted as protruding through the drain side select layer, the source side select layer, the dummy word line layer, and the word line layer. In an implementation, each vertical column comprises a vertical NAND string. For example, vertical column 502 comprises a NAND string 502A. Below the vertical column and the layers listed below is the substrate on which an insulating film and a source line SL are provided. The NAND string of the vertical column 502 has a source end at the bottom of the stack and a drain end at the top of the stack. Consistent with FIG. 5G, FIG. 5B shows the vertical column 502 connected to a bit line 5051 via a connector 516. Local interconnects 507 and 508 are also depicted.

For ease of reference, drain side select layers SGD0, SGD1, SGD2, and SGD3, source side select layers SGS0, SGS1, SGS2, and SGS3, dummy word line layers TSWL0, TSWL1, BDWL0, BDWL1, WLDL, WLDU, and word line layers WLL0 to WLL127 are collectively referred to as conductive layers. In an implementation, a conductive layer may be made of a combination of TiN and tungsten. In other implementations, a conductive layer may also be formed using other materials, such as doped polysilicon, metals such as tungsten or metal suicides. In some implementations, the different conductive layers may be formed of different materials. Between the conductive layers are dielectric layers DL0 to DL145. For example, a dielectric layer DL104 is above a word line layer WL94 and below a word line layer WL95. In an implementation, the dielectric layer may be made of $SiO_2$. In other implementations, other dielectric materials may be used to form the dielectric layer.

Thereinto, non-volatile memory cells are formed along vertical columns extending through alternating conductive and dielectric layers in the stack. In an implementation, the memory cells are arranged in NAND strings. The word line layers WL0 to WL127 are connected to memory cells (which may also be referred to as word line layers WL0 to WL127 being coupled to the memory cells, and these memory cells may also be referred to as data memory cells). The dummy word line layers TSWL0, TSWL1, BDWL0, BDWL1, WLDL, and WLDU are connected to the dummy memory cells. Dummy memory cells do not store host data and are not eligible to store host data (data provided from the host, such as data from host users), whereas data memory cells are eligible to store host data. In some implementations, the data storage cells and the dummy storage cells may have the same structure. The dummy word lines are connected to the dummy memory cells. The drain side select layers SGD0, SGD1, SGD2, and SGD3 are used to electrically connect and disconnect the NAND strings to and from the bit lines. Source side select layers SGS0, SGS1, SGS2, and SGS3 are used to electrically connect and disconnect the NAND string to and from the source line SL.

FIG. 5B also shows a bonding region. In an implementation, etching the 128 word line layers mixed with the dielectric layers is expensive and/or challenging. To alleviate this burden, an implementation comprises laying a first stack of 64 word line layers alternating with dielectric layers, laying a bonding region, and laying a second stack of 64 word line layers alternating with dielectric layers. The bonding region is positioned between the first stack and the second stack. The bonding region is used to connect the first stack to the second stack. In FIG. 5B, the first stack may be labeled as a lower set of word lines; the second stack may be labeled as an upper set of word lines. In an implementation, the bonding region may be made of the same material as the word line layer. In one exemplary implementation group, the plurality of word lines (control lines) may comprise a first stack of alternating word line layers and dielectric layers, a second stack of alternating word line layers and dielectric layers, and a bonding region between the first stack and the second stack, as shown in FIG. 5B.

Figure 5C:
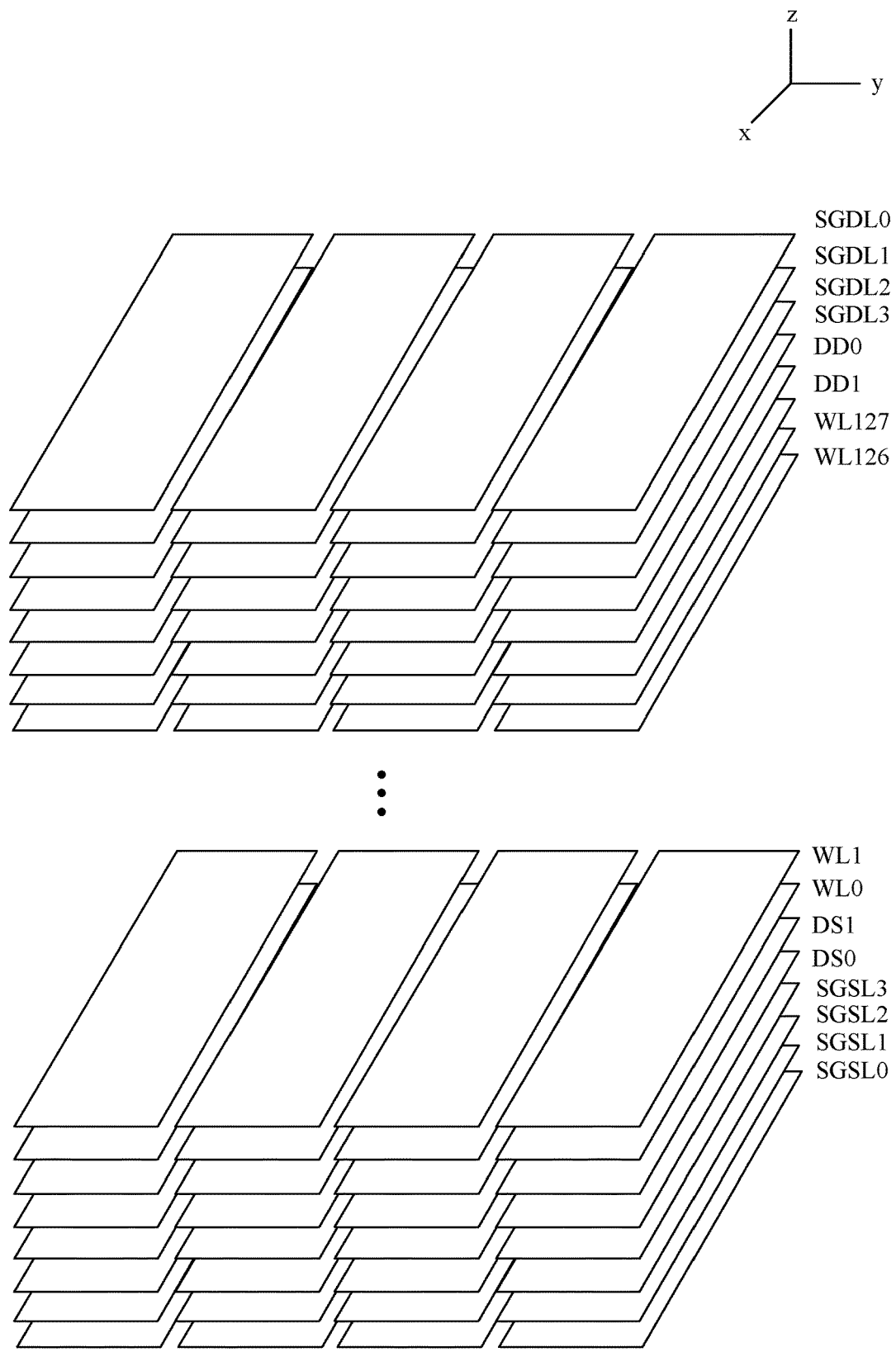

FIG. 5C depicts a logical representation of the conductive layers of a portion of the memory block in FIG. 5B, e.g., the logical representation with SGD0, SGD1, SGD2, SGD3, SGS0, SGS1, SGS2, SGS3, TSWL0, TSWL1, BDWL0, BDWL1, and word lines WL0 to WL127. According to the description with respect to FIG. 5A above, in an implementation, local interconnects 506, 507, 508, 509, and 510 divide a conductive layer into four regions/fingers (or memory sub-blocks), e.g., word line layer WL126 being divided into regions 517, 518, 519 and 520. Because of having word line layers WL0 to WL95, the regions are referred to as word line fingers, so word line layer WL94 is divided into word line fingers 517, 518, 519 and 520 by local interconnects 506, 507, 508, 509, and 510. During the course of actual use, the region 517 is a word line finger on a word line layer. In an implementation, four word line fingers on the same level are connected together. In another implementation, each word line finger operates as a separate word line. The drain side select gate layer SGD0 (top layer) is also divided into regions 511, 512, 513, and 514, also referred to as fingers or select line fingers. In an implementation, four select line fingers on the same level are connected together. In another implementation, each select line finger operates as a separate word line.

Figure 5D:
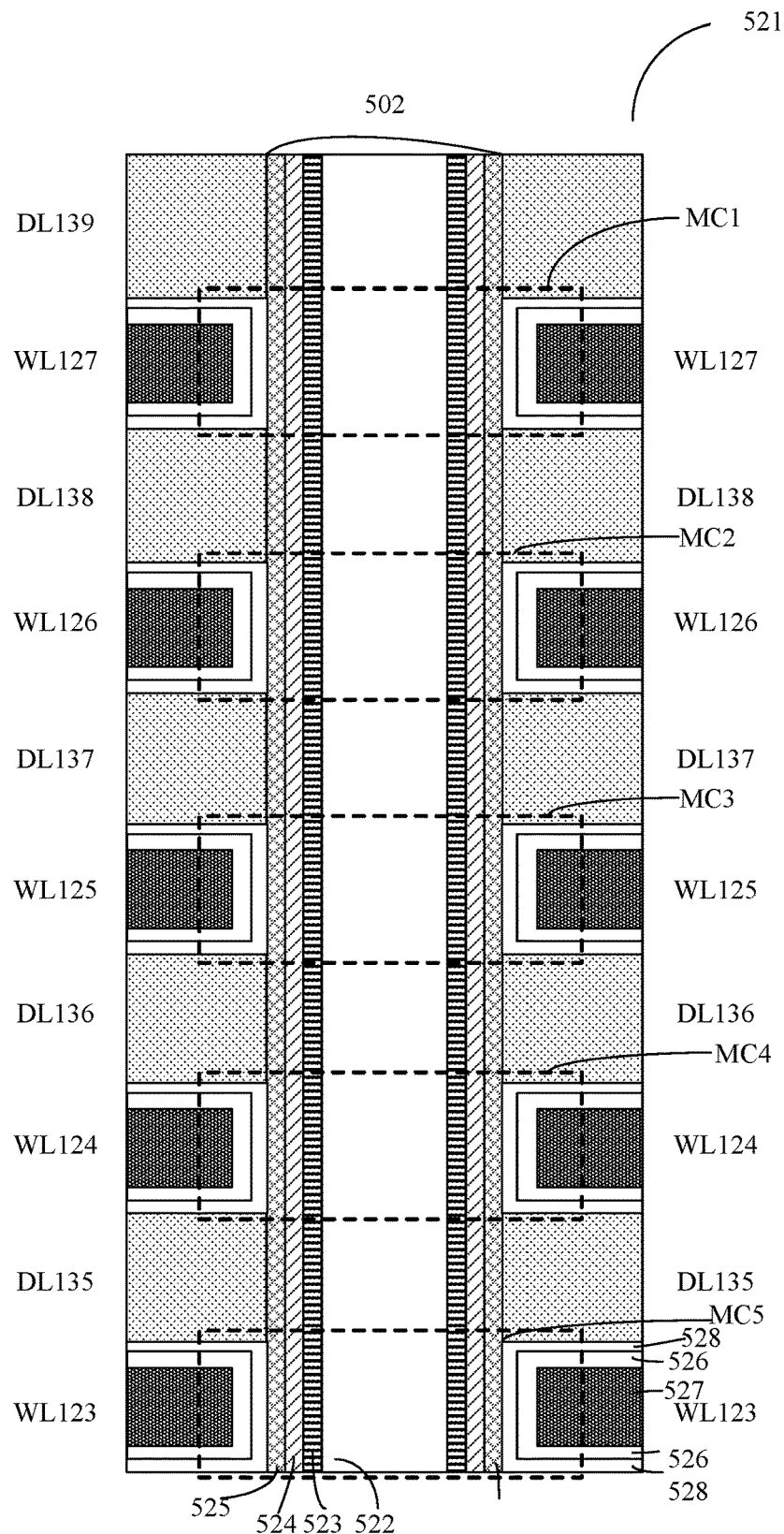

FIG. 5D depicts a cross-sectional view of region 521 of FIG. 5B comprising a portion of vertical column 502 (memory holes). In an implementation, the vertical columns are circular; however, in other implementations, other shapes may be used. In an implementation, the vertical columns 502 may comprise an inner core layer 522 made of a dielectric such as $SiO_2$. Other materials can also be used. Surrounding the inner core layer 522 is a polysilicon channel 523. Materials other than polysilicon can also be used. It should be noted that the channel 523 is connected to a bit line and a source line. Surrounding the channel 523 is a tunneling dielectric 524. In an implementation, the tunneling dielectric 524 has an ONO structure. Surrounding the tunneling dielectric 524 is a charge trapping layer 525, such as silicon nitride. Other memory materials and structures can also be used. The techniques described herein are not limited to any particular material or structure.

FIG. 5D depicts dielectric layers DL139, DL138, DL137, DL136, and DL135, and word lines WL127, WL126, WL125, WL124, and WL123. Each of the word line layers comprises a word line region 527 surrounded by an aluminum oxide layer 526 surrounded by a blocking oxide layer 528. The physical interaction of the word line layers with the vertical columns forms memory cells. Thus, in an implementation, the memory cell comprises a channel 523, a tunneling dielectric 524, a charge trapping layer 525, a blocking oxide layer 528, an aluminum oxide layer 526, and a word line region 527. For example, the word line layer WL127 and a portion of a vertical column 502 constitute a memory cell MC1. The word line layer WL126 and a portion of the vertical column 502 constitute a memory cell MC2. The word line layer WL125 and a portion of the vertical column 502 constitute a memory cell MC3. The word line layer WL124 and a portion of the vertical column 502 constitute a memory cell MC4. The word line layer WL123 and a portion of the vertical column 502 constitute a memory cell MC5. In other architectures, the memory cells may have different structures; however, the memory cells will still be data memory cells.

When a memory cell is programmed, electrons are stored in a portion of the charge trapping layer 525 associated with the memory cell. In response to an appropriate voltage on the word line region 527, these electrons are attracted from the channel 523 into the charge trapping layer 525 through the tunneling dielectric 524. The threshold voltage ($V_{th}$) of the memory cell increases proportionally to the amount of stored charge. In an implementation, programming is accomplished by Fowler-Nordheim tunneling of electrons into the charge trapping layer. During the erasing operation, electrons return to the channel, or holes are injected into the charge trapping layer to recombine with electrons. In an implementation, erasing is accomplished using hole injection into the charge trapping layer through a physical mechanism such as gate-induced drain leakage (GIDL).

Figure 5E:
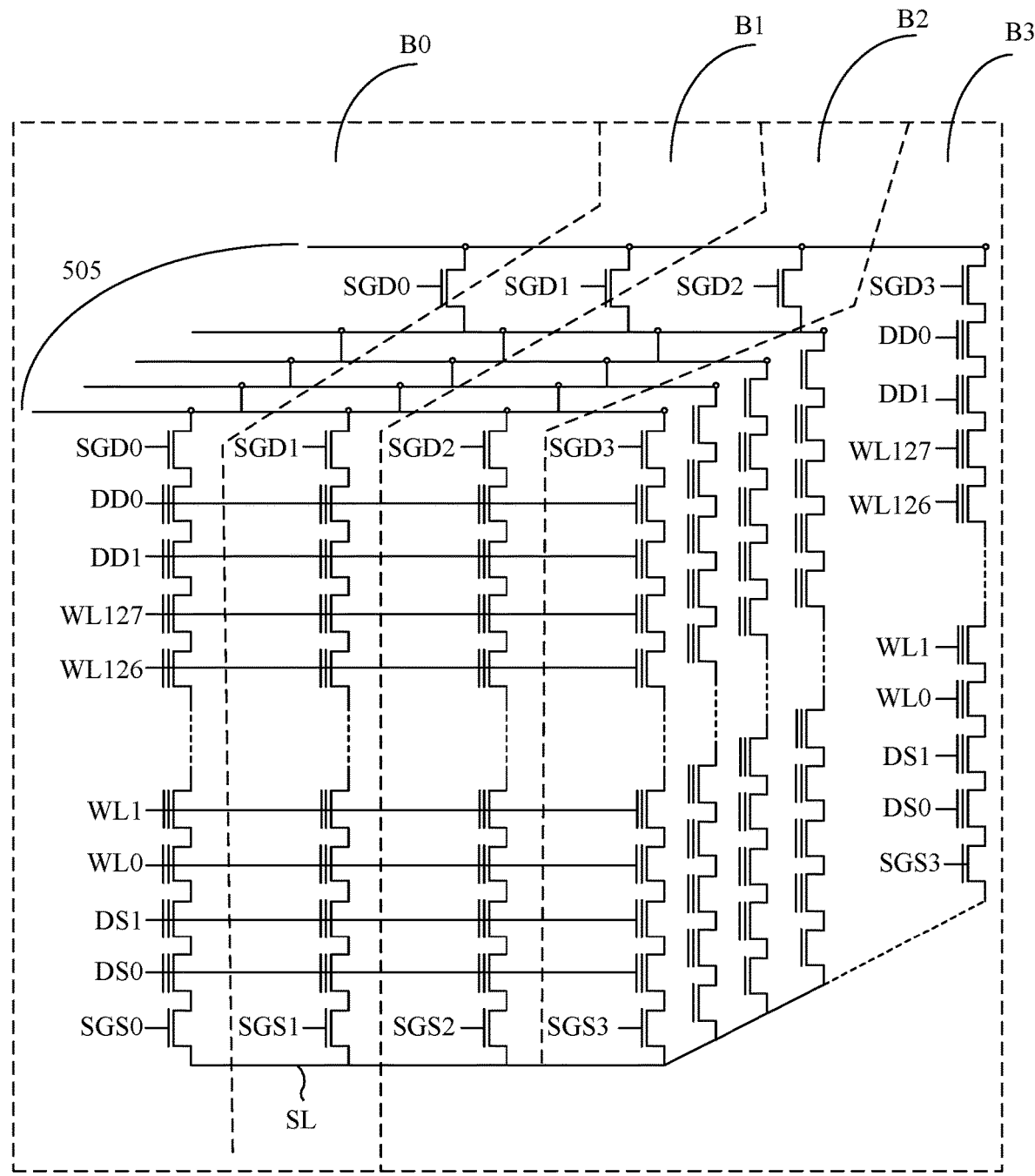

FIG. 5E is a schematic diagram of a portion of the memory depicted in FIG. 4 to FIG. 5D. FIG. 5E shows physical word lines WL0 to WL127 extending across an entire block. The structure of FIG. 5E corresponds to a portion of the memory block 400 of FIG. 5A to FIG. 5D, comprising the bit line 505. Within this memory block, each bit line is connected to four NAND strings. Drain side select lines SGD0, SGD1, SGD2 and SGD3 are used to determine which of the four NAND strings is connected to the associated one or more bit lines. Source side select lines SGS0, SGS1, SGS2, and SGS3 are used to determine which of the four NAND strings is connected to the common source line. It is also possible to consider dividing the block into four memory sub-blocks B0, B1, B2, and B3. The memory sub-block B0 corresponds to a vertical NAND string controlled by SGD0 and SGS0, the memory sub-block B1 corresponds to a vertical NAND string controlled by SGD1 and SGS1, the memory sub-block B2 corresponds to a vertical NAND string controlled by SGD2 and SGS2, and the memory sub-block B3 corresponds to a vertical NAND string controlled by SGD3 and SGS3.

It should be noted that the exemplary memory system of FIG. 4 to FIG. 5E is a three-dimensional memory structure comprising vertical NAND strings with a charge trapping material, but it is also possible to use other (2D and 3D) memory structures with the techniques described herein.

Figure 6:
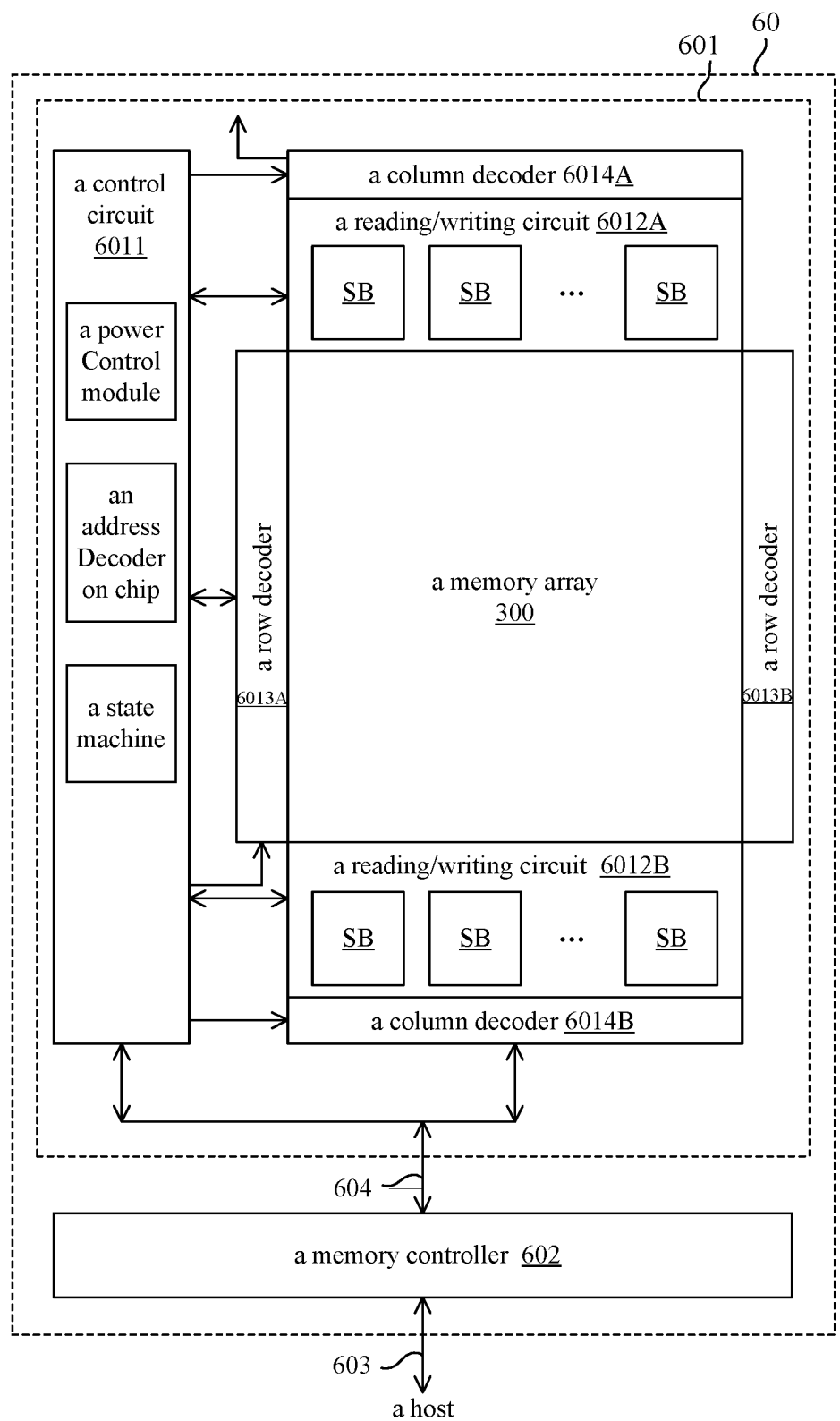
FIG. 6 is a schematic diagram of a structure of a memory device having a reading/writing circuit for parallel reading and programming of a memory cell array provided according to an implementation of the present disclosure.

Returning to the memory array shown based on FIG. 3, FIG. 6 shows a schematic diagram of a structure of a memory system 60 of the reading and writing circuits formed based on the memory array shown in FIG. 3 and for reading and/or programming pages (or other units) of the memory array in parallel provided according to an implementation of the present disclosure.

As shown in FIG. 6, the memory system 60 comprises a memory device 601 and a memory controller 602, wherein the memory device 601 comprises a memory array 300 (two-dimensional or three-dimensional) and peripheral circuits, the peripheral circuits comprise: a control circuit 6011, a reading/writing circuits 6012A and 6012B, row decoders 6013A and 6013B, and column decoders 6014A and 6014B. In some implementations, accesses to the memory array 300 by various peripheral circuits are implemented in a symmetrical manner on opposite sides of the memory array 300 to make the access on each side first and reduce the density of circuits by half. Reading/writing circuits 6012A and 6012B comprise a plurality of sense blocks SB for reading or programming pages of the memory array 300 in parallel. The memory array 300 may be addressed by word lines via row decoders 6013A and 6013B and bit lines via column decoders 6014A and 6014B. In some implementations, the memory array 300, the control circuit 6011, the reading/writing circuits 6012A and 6012B, the row decoders 6013A and 6013B, and the column decoders 6014A and 6014B may be fabricated on a chip, wherein the dashed box in the middle of FIG. 6 can also represent a chip. External signals and data are transferred between the host and the memory controller 602 via a signal line 603 and transferred between the memory controller 602 and a chip via a signal line 604.

The control circuit 6011 is configured to cooperate with reading/writing circuits 6012A and 6012B to perform store operations on the memory array 300. The control circuit 6011 comprises a state machine, an address decoder on the chip, and a power control module, wherein the state machine is configured to provide a chip-level control of memory operations; the address decoder on the chip is configured to provide an address interface between an address used by the host or the controller of the memory system and a hardware address used by row decoders 6013A and 6013B and column decoders 6014A and 6014B. The power control module is configured to provide power and voltage to the word lines and bit lines each time the memory controller performs some operations.

The memory arrays in the memory systems discussed above can be erased, programmed, and read. At the end of a successful programming process (with verification), when appropriate, the threshold voltages of the programmed memory cells should be within one or more distributions for the threshold voltages of the programmed memory cells or within the distribution for threshold voltages of the erased memory cells.

Figure 7:
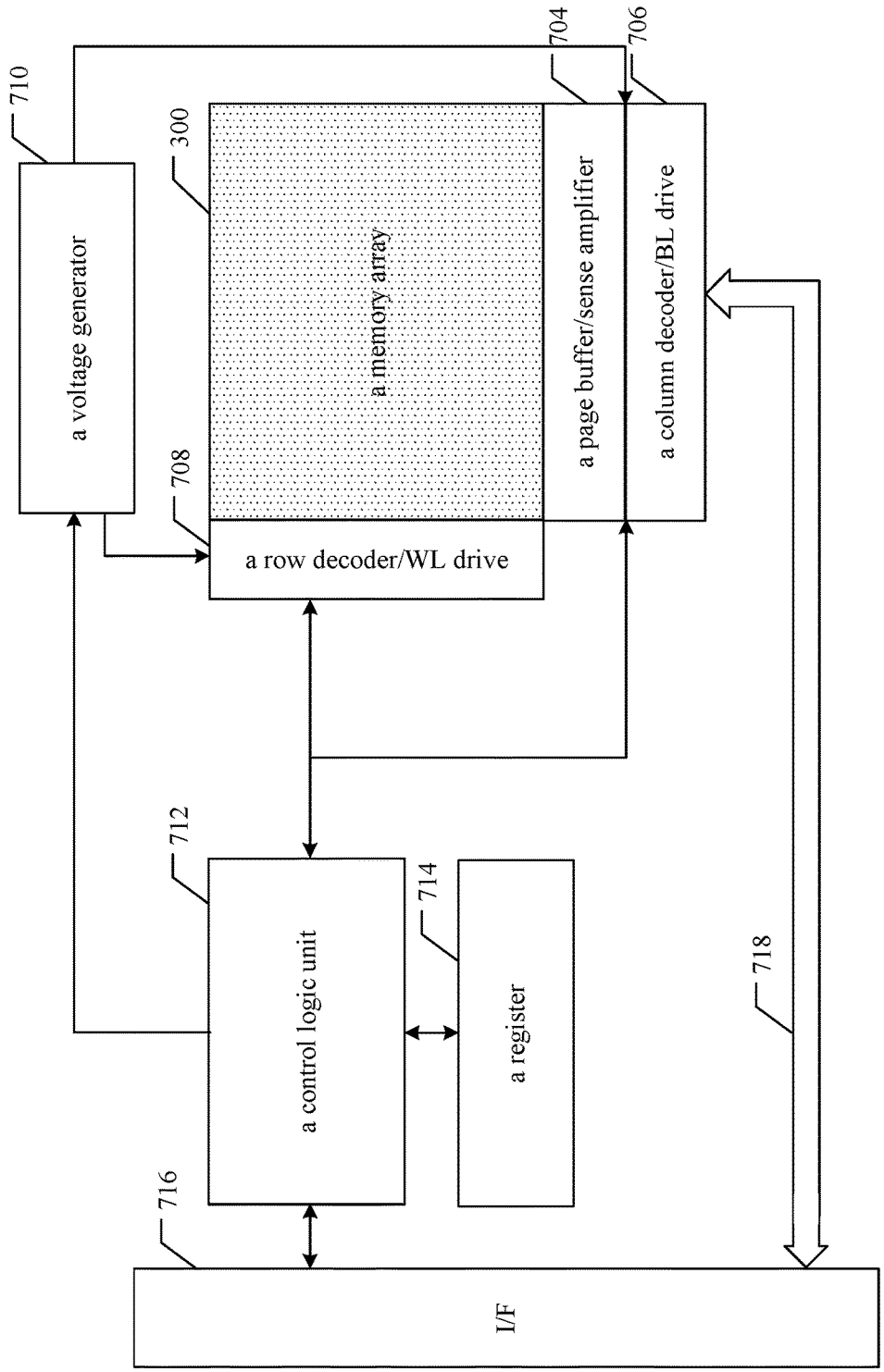
FIG. 7 is a schematic diagram of a structure between a peripheral circuit and a memory array provided according to an implementation of the present disclosure.

Although the relationship between the peripheral circuits and the memory array 300 is described in detail above, in some other implementations, the peripheral circuits and the memory array may also be shown in the structure of FIG. 7 below. FIG. 7 shows a block diagram of an exemplary memory device comprising a memory array and peripheral circuits in accordance with some aspects of the present disclosure.

FIG. 7 shows some exemplary peripheral circuits comprising a page buffer 704, a column decoder 706, a row decoder 708, a voltage generator 710, a control logic unit 712, a register 714, and an input/output (I/O) circuit 716. It should be understood that, in some examples, an additional peripheral circuit not shown in FIG. 7 may also be comprised.

The page buffer 704 may be connected to the memory cell array 300 via bit lines and configured to read data from and program (write) data to the memory array 300 according to a control signal from the control logic unit 712. In one example, the page buffer 704 may store a page of programmed data (written data) to be programmed into one memory page of the memory array 300. In another example, the page buffer 704 may sense a signal from a bit line to verify that data has been properly programmed into a target memory cell coupled to a selected word line 718. In yet another example, in a reading operation, the page buffer 704 may also sense a low power signal from a bit line representing a data bit stored in a memory cell and amplify a small voltage swing to an identifiable logic level. The column decoder 706 may be configured to be controlled by the control logic unit 712 and to select one or more NAND memory strings by applying a bit line voltage generated from the voltage generator 710.

The row decoder 708 may be connected to the memory array 300 via a word line, and may select a word line based on a row address. The row decoder 708 may be configured to be controlled by the control logic unit 712 according to a control signal, and to select/deselect a memory block of the memory array 300, and to select/deselect a selected row of a memory block. The row decoder 708 may also be configured to provide a word line voltage generated from the voltage generator 710 to a word line. In some implementations, the row decoder 708 may also provide an SSG voltage and a DSG voltage generated from the voltage generator 710 to a drive SSG line 315 and DSG line 313.

The voltage generator 710 may be configured to be controlled by the control logic unit 712 and to generate various voltages that are provided to memory array 300, such as a word line voltage (e.g., a reading voltage, a programming voltage, a pass voltage, a verifying voltage, etc.), an SSG voltage (a select/deselect voltage), a DSG voltage (a select/deselect voltage), a bit line voltage and a source line voltage, and the like.

The control logic unit 712 may be coupled to each of the peripheral circuits described above and configured to control the operation of the respective peripheral circuits. The register 714 may be coupled to the control logic unit 712 and comprise a state register, a command register, and an address register for storing state information, command opcodes, and command addresses for controlling the operation of each peripheral circuit. The control logic unit 712 may be implemented by a microprocessor, a microcontroller (aka a microcontroller unit (MCU)), a digital signal processor (DSP), an application specific integrated circuit (ASIC), a field programmable gate array (FPGA), a programmable logic device (PLD), a state machine, a gated logic unit, a discrete hardware circuit, or a combination thereof, and other suitable hardware, firmware and/or software configured to perform the various functions described in detail below.

The input/output circuit 716 may be coupled to the control logic unit 712 and act as a control buffer to buffer a control command received from the memory controller 602 and relay it to the control logic unit 712, as well as to buffer state information received from the control logic unit 712 and relay it to the memory controller. The input/output circuit 716 may also be coupled to a column decoder 706 and act as a data input/output interface and a data buffer to buffer data and relay it to the memory array 300 or relay or buffer data from memory array 300.

It should be noted that FIG. 6 and FIG. 7 describe the peripheral circuits and the memory array from different angles, wherein the control circuit in FIG. 6 and the control logic unit in FIG. 7 are just different names described from different angles, both have the same effect, and can be understood as the same structure.

Figure 8:
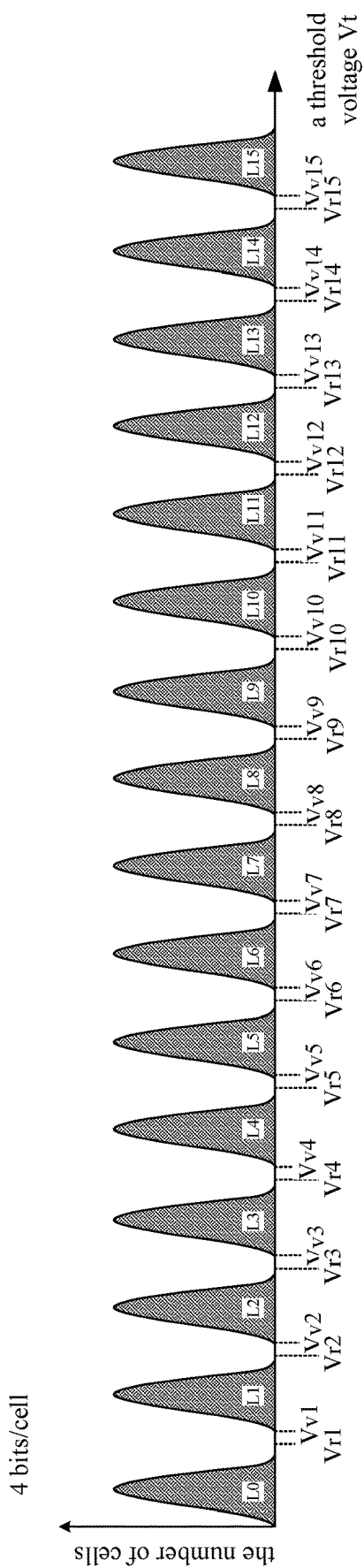
FIG. 8 is a graph of a threshold voltage versus the number of memory cells provided according to an implementation of the present disclosure.

FIG. 8 is a graph of the threshold voltage versus the number of memory cells, and illustrates an exemplary threshold voltage distribution of a memory array when each memory cell stores four bits of data. However, other implementations may use other data capacities per memory cell, such as the aforementioned SLC storing 1 bit of data, MLC storing 2 bits of data, TLC storing 3 bits of data, PLC storing 5 bits of data, etc. A memory cell that stores more than one bit of data is called a multi-level cell MLC. FIG. 8 shows 16 threshold voltage distributions, which correspond to 16 threshold voltage distributions: E (also referred to as L0), L1, L2, L3, L4, L5, L6, L7, L8, L9, L10, L11, L12, L13, L14, L15, and the threshold voltages increase sequentially. Likewise, the threshold voltage distribution E corresponds to an erased data state; the threshold voltage distributions L1, L2, L3, L4, L5, L6, L7, L8, L9, L10, L11, L12, L13, L14, L15 correspond to programmed data state, and for the data state N, it has a higher threshold voltage than the data state N−1 and a lower threshold voltage than the data state N+1. In some implementations, a QLC type memory cell stores four bits of data, and an erased memory cell may store data 1111, memory cells programmed to L1, L2, L3, L4, L5, L6, L7, L8, L9, L10, L11, L12, L13, L14, L15 data states can sequentially store data 1110, 1101, 1100, 1011, 1010, 1001, 1000, 0111, 0110, 0101, 0100, 0011, 0010, 0001, 0000. For data state N, the data state N has a higher threshold voltage than the data state N−1 and a lower threshold voltage than the data state N+1. The first threshold voltage distribution corresponds to the data state L0, representing an erased memory cell. The other 15 threshold voltage distributions correspond to data states L1 to L15, representing programmed memory cells and therefore also referred to as programmed data states. In some implementations, data states L1-L15 may overlap, with the memory controller 602 relying on error correction to identify the correct data being stored. FIG. 8 also shows 15 reading reference voltages Vr1, Vr2, Vr3, Vr4, Vr5, Vr6, Vr7, Vr8, Vr9, Vr10, Vr11, Vr12, Vr13, Vr14, Vr15 for reading data from the memory cells, and the specific reading process can be: testing, such as performing a sensing operation, given whether the threshold voltage of the memory cell is higher or lower than 15 reading reference voltages, the memory system can determine the data state of the memory cell.

FIG. 8 also shows 15 verifying reference voltages Vv1, Vv2, Vv3, Vv4, Vv5, Vv6, Vv7, Vv8, Vv9, Vv10, Vv11, Vv12, Vv13, Vv14, and Vv15, which can also be referred to as verifying target voltages. When programming memory cells to the data state L1, the memory system will test if the memory cells have a threshold voltage more than or equal to Vv1. When programming a memory cell to the data state L2, the memory system will test if the memory cell has a threshold voltage more than or equal to Vv2. When programming a memory cell to the data state L3, the memory system will determine if the memory cell has a threshold voltage more than or equal to Vv3. When programming memory cells to the data state L4, the system will test if the memory cells have a threshold voltage more than or equal to Vv4. When programming memory cells to the data state L5, the memory system will test if the memory cells have a threshold voltage more than or equal to Vv5. When programming memory cells to the data state L6, the memory system will test if the memory cells have a threshold voltage more than or equal to Vv6. When programming memory cells to the data state L7, the memory system tests if these memory cells have a threshold voltage more than or equal to Vv7, and the remaining data states are in turn verified if they have threshold voltages more than or equal to Vv8, Vv9, Vv10, Vv11, Vv12, Vv13, Vv14 and Vv15 to determine if they are programmed to L8, L9, L10, L11, L12, L13, L14, L15. In an implementation referred to as full sequence programming, a memory cell can be programmed directly from an erased data state L0 to any of the programmed data states L1-L15. For example, a population of memory cells to be programmed may be erased first, such that all memory cells in the population are in erased data state L0. A programming process is then used to program the memory cells directly to one of the data states L1, L2, L3, L4, L5, L6, L7, L8, L9, L10, L11, L12, L13, L14, L15. For example, while some memory cells are being programmed from the data state L0 to the data state L1, other memory cells are being programmed from the data state L0 to the data state L2 and/or programmed from the data state L0 to the data state L3, and so on. The arrows in FIG. 8 indicate a full sequence programming. In addition to the full sequence programming, the techniques described herein may also be used with other types of programming, comprising but not limited to multilevel programming/multiphase programming.

Each threshold voltage distribution (data state) of FIG. 8 corresponds to a predetermined value for a set of data bits stored in a memory cell. The specific relationship between the data programmed into a memory cell and a threshold voltage level of the memory cell depends on a data encoding scheme employed by the memory cell. In an implementation, Gray codes are used to assign data values to a range of threshold voltages such that if the threshold voltage of the memory is erroneously shifted to its adjacent physical state, only one bit will be affected.

In general, during verifying and reading operations, the selected word line is connected to a voltage, which is a reference signal and the level of which is specified for each reading operation (e.g., see the reading reference voltage of FIG. 8) or a verifying operation (e.g., see the verifying reference voltage of FIG. 8) to determine if the threshold voltage of the associated memory cell has reached this level. After the voltage is applied to the word line, the conduction current of the memory cell is measured to determine if the memory cell turns on in response to the voltage applied to the word line (if there is a conduction current, and the magnitude of the conduction current is measured). If the conduction current is measured to be more than a specific value, it is assumed that the memory cell is turned on and the voltage applied to the word line is more than the threshold voltage of the memory cell. If the conduction current is not measured to be more than a specific value, it is assumed that the memory cell is not turned on and the voltage applied to the word line is not more than the threshold voltage of the memory cell. During the reading or verifying process, unselected memory cells are provided with one or more pass voltages, also referred to as bypass voltages, at their control gates, so that these memory cells will operate as pass gates, and these memory cells conduct current regardless of whether they are programmed or erased.

There are many ways to measure the conduction current of a memory cell during a reading or verifying operation. In one example, the conduction current of the memory cell is measured as the rate at which the memory cell discharges or charges a dedicated capacitor in the sense amplifier. In another example, the conduction current of a selected memory cell allows (or does not allow) the NAND string comprising the memory cell to discharge a corresponding bit line, the voltage on the bit line is measured after a certain period of time to see if it has been discharged. It should be noted that the techniques described herein can be used with different methods known in the art for verifying/reading. Other reading and verifying techniques known in the art can also be used.

Figure 9:
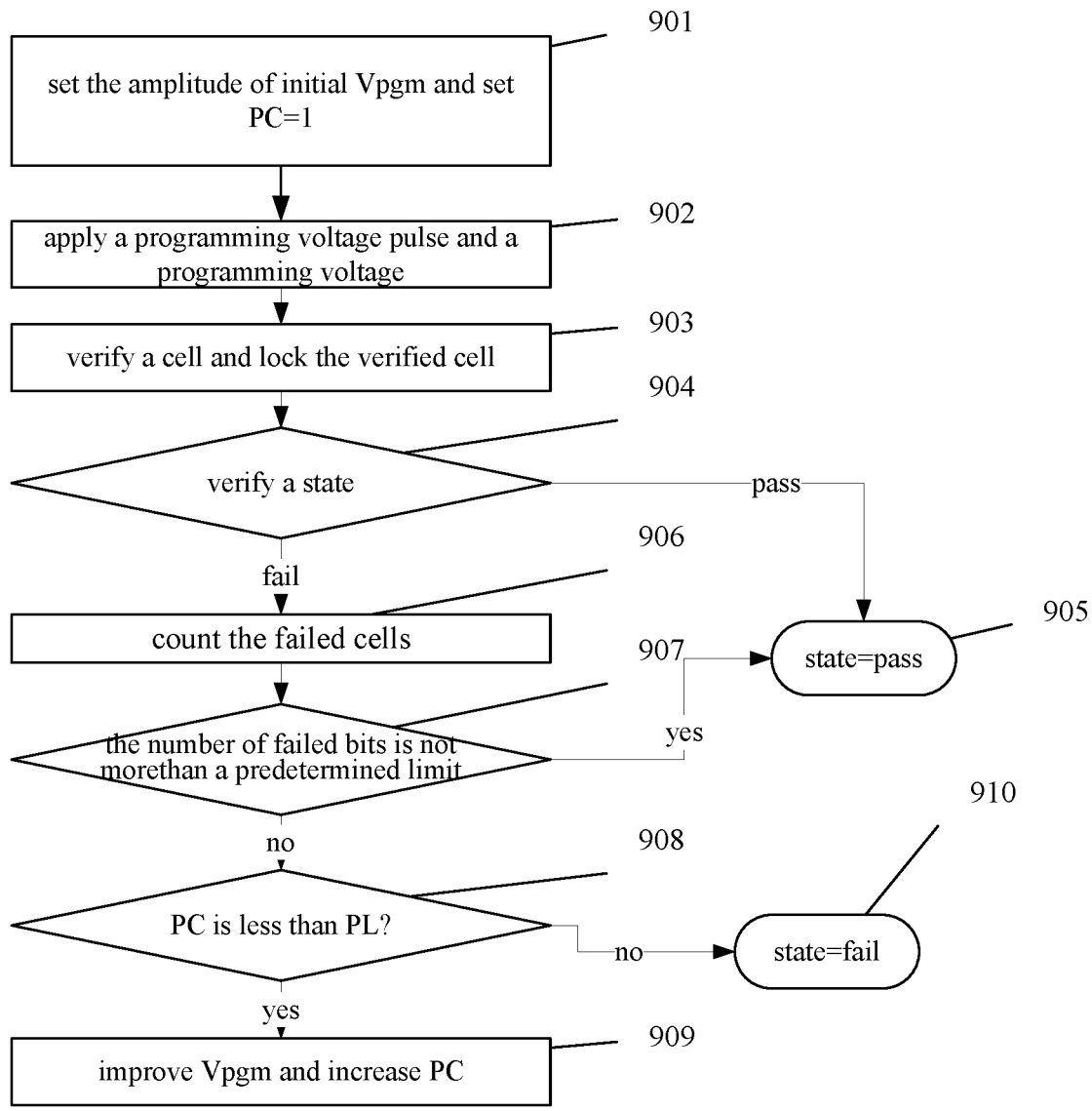
FIG. 9 is a flowchart of programming provided according to an implementation of the present disclosure.

FIG. 9 is a flowchart describing an implementation of a process performed by a memory device 601 for programming. In one exemplary implementation, the process of FIG. 9 is executed on the memory device 601 under the direction of a state machine using the control circuit discussed above. The process of FIG. 9 is performed to implement the full sequence programming of FIG. 8 or other programming schemes comprising multi-level programming. When implementing multi-level programming, the process of FIG. 8 is used to implement any/each stage of the multi-level programming process.

Figure 10:
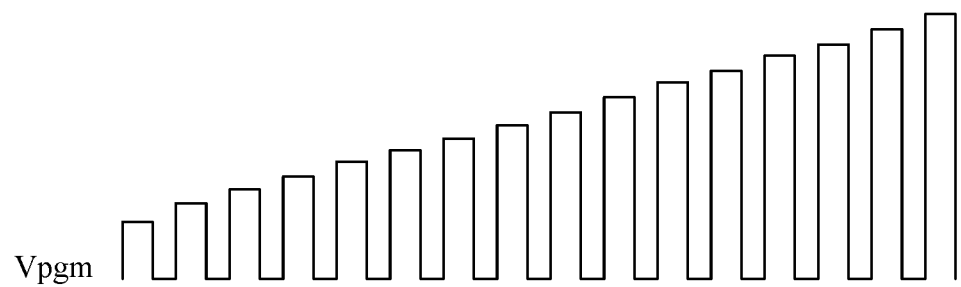
FIG. 10 is a schematic diagram of a structure of a programming pulse in an ISPP mode provided according to an implementation of the present disclosure.

Typically, the programming signal Vpgm (also referred to as programming voltage, programming pulse) is applied to the control gate (applied via a selected word line) as a series of programming voltage pulses during a programming operation, as shown in FIG. 10. Between the programming pulses is a set of verifying pulses to perform verification. In some implementations, the magnitude of Vpgm increases with each successive pulse by a predetermined step size, e.g., which may range from 0.2v to 0.5v. In step 901 of FIG. 9, the programming voltage (Vpgm) is initialized to a starting amplitude, e.g., the starting amplitude being any level of about 12V to 16V, or another suitable level, and a programming counter PC maintained by the state machine is initialized to 1. In step 902, a programming pulse of Vpgm is applied to the selected word line (the selected word line is the word line selected for programming). In an implementation, a group of memory cells being programmed at the same time are all connected to the same word line (that word line is the selected word line). Unselected word lines receive one or more boost voltages (or referred to as pass voltages), e.g., about 7 volts to 11 volts, to perform a boost scheme known in the art. In an implementation, if the memory cell should be programmed, the corresponding bit line is grounded. On the other hand, if the memory cell should remain at its current threshold voltage, the corresponding bit line is connected to Vdd, e.g., 1V to 3.5V, to inhibit programming. In step 902, a programming voltage pulse is applied simultaneously to all memory cells connected to the selected word line, such that all memory cells connected to the selected word line are programmed simultaneously. That is, they are programmed at the same time or during overlapping times (both are considered simultaneous). In this way, all memory cells connected to the selected word line will have their threshold voltages changed simultaneously unless they have been locked out to inhibit programming.

In step 903, one or more verifying operations are performed to verify the appropriate memory cells using a set of appropriate verifying reference voltages. In an implementation, the verifying process is performed by testing if the threshold voltage of the memory cell selected for programming has reached an appropriate verifying reference voltage.

In step 904, it is determined if all memory cells have reached their first threshold (pass). If so, the programming process is completed and successful because all selected memory cells have been programmed and their target states are verified. In step 905, a "pass" (or success) state is reported. If it is determined in step 904 that not all memory cells have reached their first threshold (fail), then the programming process will continue to step 906.

In step 906, the system counts the number of the memory cells that have not reached their corresponding first threshold distribution. That is, the system counts the number of the memory cells for which the verifying process has failed so far. This counting can be done by a state machine, a memory controller 602, or other logic components. In a specific implementation, each of the sense blocks will store the state (pass/fail) of its corresponding memory cell. In an implementation, there is a total count that reflects the total number of the memory cells currently being programmed and for which the last verifying step has failed. In another implementation, a separate count is kept for each data state.

In step 907, it is determined if the count from step 906 is less than or equal to a predetermined limit. In an implementation, the predetermined limit is the number of bits that can be corrected by an error correction code (ECC) during a reading process of a page of memory cells. If the number of failed cells is less than or equal to a predetermined limit, the programming process may stop and report a "pass" state in step 905. In this case, enough memory cells are correctly programmed so that the remaining few memory cells that are not fully programmed can be corrected using ECC during the reading process. In some implementations, step 906 will count the number of failed cells for each sector, each target data state, or other cells, and compare these counts separately or collectively to one or more thresholds in step 907.

In an implementation, the predetermined limit may be less than the total number of bits that can be corrected by ECC during the reading process to account for future errors. When programming less than all memory cells of a page, or comparing counts of only one data state (or less than all states), the predetermined limit may be a portion of the number of bits (proportional or not proportional) that may be corrected by ECC during the reading process of the page of memory cells. In some implementations, this limit is not predetermined. Rather, it varies based on the number of errors that have been counted for the page, the number of programing erasing cycles performed, or other criteria.

If the number of failed memory cells is not less than the predetermined limit, the programming process continues at step 908 and checks the programming counter PC against the programming limit value (PL). The programming limit value comprises, for example, 6, 20, and 30, etc.; however, other values may be used. If the programming counter PC is not less than the programming limit value PL, the programming process is considered to have failed and a "failed" state is reported in step 910. If the programming counter PC is less than the programming limit value PL, the process continues at step 909, during which the programming counter PC is incremented by one, and the programming voltage Vpgm is stepped to the next amplitude. For example, the next pulse will have an amplitude that is one step size larger than the previous pulse, e.g., a step size of 0.1 volts to 0.4 volts. After step 909, the process loops back to step 902, and another programming pulse is applied to the selected word line, causing another iteration of the programming process of FIG. 9 to be performed (steps 902 to 909).

Error correction is used in conjunction with data programming because an error can occur when programming or reading, and an error can occur when storing data (e.g., due to electronic drift, data retention problems, or other phenomena). A memory system typically uses Error Correcting Code (ECC) to protect data from corruption. Many ECC encoding schemes are well known in the art. These error correction codes are especially useful in a mass memory comprising a flash (and other non-volatile) memory, as such encoding schemes can provide a substantial influence on manufacturing yield and device reliability, making a device with several unprogrammable or defective units available. Of course, there is a trade-off between a yield saving and the cost of providing additional memory cells to store code bits (i.e., encoding "rate"). Therefore, some ECC codes are more suitable for a flash memory device than other ECC codes. In general, ECC codes for a flash memory device tend to have a higher encoding rate (i.e., a lower ratio of code bit/data bit) than codes used in data communication applications (which may have an encoding rate as low as ½). Examples of well-known ECC codes commonly used in conjunction with a flash memory storage device comprise Reed-Solomon codes, other BCH codes, Hamming codes, and the like. Sometimes, error correction codes used in conjunction with a flash memory storage device are "systematic" in that the data portion of the final codeword is unchanged from the actual data being encoded, with code or parity bits appended to the data bits to form the complete codeword.

Specific parameters for a given error correction code comprise the type of code, the size of the block of actual data from which the codeword is derived, and the total length of the codeword after encoding. For example, a typical BCH code applied to a 512-byte (4096-bit) sector of data can correct at most four erroneous bits if at least 60 ECC or parity bits are used. Reed-Solomon codes are a subset of BCH codes and are also commonly used for error correction. For example, a typical Reed-Solomon code can correct at most four errors in a 512-byte sector of data using about 72 ECC bits. In the case of flash memory, error correction coding provides significant improvements in manufacturing yield and reliability of flash memory over time.

In some implementations, the memory controller 602 receives host data (also referred to as user data or data from entities external to the memory system), also referred to as information bits, to be stored in non-volatile memory. The information bits are represented by the matrix i=[1 0] (note that two bits are for example purposes only, and many implementations have codewords longer than two bits). An error correction encoding process (such as any process mentioned above or below) is implemented by the ECC engine of the memory controller 602, wherein the parity bits are added to the information bits to provide data represented by a matrix or codeword v=[1 0 1 0], indicating that two parity bits have been appended to the data bits. Other techniques for mapping input data to output data in more sophisticated ways can be used. For example, Low Density Parity Check (LDPC) codes, also referred to as Gallager codes, can be used. In an implementation, such LDPC codes are generally applied (e.g., by an ECC engine) to a plurality of pages encoded across a plurality of memory elements, but they need not to be applied across a plurality of pages. Data bits can be mapped to logical pages and stored in the memory array by programming one or more memory cells to one or more programmed states corresponding to v.

In an implementation, programming is used to raise the threshold voltage of a memory cell to one of the programming data states L1 to L15. Erase is used to lower the threshold voltage of the memory cell to the erased data state L0.

One technique for erasing memory cells in some memory devices is to bias the p-well (or other types) substrate to a high voltage to charge the NAND channel. An erase-enabled voltage is applied to the control gate of the memory cell while keeping the NAND channel at a high voltage to erase the non-volatile memory element (memory cell). Another method of erasing memory cells is to generate gate-induced drain leakage (GIDL) current to charge the NAND string channel. An erase-enabled voltage is applied to the control gate of the memory cell while maintaining the string channel potential to erase the memory cell.

In an implementation, electron-hole pairs are generated by the effect of band-to-band tunneling caused by the voltage difference between the drain and the gate at the select transistor, to produce gate-induced drain leakage (GIDL) current. In an implementation, the GIDL current can cause one type of carrier (e.g., holes) to move primarily into the NAND channel, thereby raising the potential of the channel. Another type of carrier, e.g., electrons, is extracted from the channel by an electric field in the direction of the bit line or in the direction of the source line. During erasing, holes can tunnel from the channel into the charge storage region of the memory cell and recombine with electrons therein to lower the threshold voltage of the memory cell.

Thereinto, the GIDL current can be generated at either end of the NAND string, for example, the voltage difference between the two terminals of a select transistor (e.g., the drain side select transistor) connected to the bit line can generate the first GIDL current; for another example, the voltage difference between the two terminals of the select transistor (e.g., the source side select transistor) connected to the source line can generate the second GIDL current. Erasing based on the GIDL current at only one end of the NAND string is called one-side GIDL erasing. Erasing based on the GIDL current at both ends of the NAND string is called two-side GIDL erasing. It should be noted that, when programming the selected word line, the voltage (a programming voltage Vpgm is applied) applied to the selected word line is different from the voltage (a pass voltage Vpass is applied) applied to the unselected word line, the top dummy word line, and the bottom dummy word line, and in general, Vpgm is not less than Vpass.

After research, it was found that in 3D memory devices, since adjacent word lines may be applied with different voltages or be in different programmed states, the resulting potential difference between adjacent word lines will produce hot carriers injected from a low-potential word line to a high-potential word line, make the threshold voltage of the memory cell coupled to the high potential word line increase, and this phenomenon is called a hot carrier injection effect.

The aforementioned phenomenon of hot carrier injection, for example, in a 3D NAND with 128 word line layers (the word line numbers are sequentially word lines WL0, WL1, WL2, . . . , WLN-1 from bottom to top, where N is an integer not less than 1), during the programming of the memory cells coupled to the word lines WL3 to WL127, is especially significant between the word line WL2 and the word line WL1. Under the influence of this hot carrier injection effect, the threshold voltage corresponding to the erased state of the memory cell coupled to the word line WL1 will drift toward the positive direction (generally, the threshold voltage corresponding to the erased state is negative), thus a first readable distribution corresponding to the memory cells coupled to the word line WL1 will be affected.

It should be noted that the first readable distribution may refer to a voltage interval between the threshold voltage distribution corresponding to the first programming data state and the threshold voltage distribution corresponding to the erased state of the memory cells coupled to the word line WL1, which can be used to read the data on the memory cell in the erased state, this voltage interval can also be called E0, as shown in FIG. 8, in the QLC type memory cell, a voltage interval between the lower tail of the threshold voltage distribution corresponding to the data state L0 and the voltage Vr1 is the first readable distribution E0. Those skilled in the art should know that for a QLC type memory cell, there are two readable distributions between every two adjacent data states, and the previous readable distribution is used to read the data on the memory cell in the previous data state, and the latter readable distribution is used to read the data on the memory cell in the latter data state. For example, the readable distribution between the data state L0 and the data state L1 includes E0 and E1, wherein E0 is also the aforementioned first readable distribution, E1 is the voltage interval between the voltage Vr1 and the upper tail of the threshold voltage distribution corresponding to the data state L1. In some implementations, for a QLC type memory cell, the total readable distributions can include: E0, E1, . . . , E29, a total of 30 readable distributions, which can be recorded as: Esum=E0+E1+ . . . +E29.

In the above-mentioned situation, especially when QLC is used for the memory cells coupled to the word line WL1 and the memory cells coupled to word lines above WL1, during programming of the memory cells coupled to WL3 to WL127, hot carriers injected from the word line WL2 to the word line WL1 are generated due to the potential difference existing between the memory cell coupled to WL1 and in the lowest data state (L0) and the memory cell coupled to WL2 and in the highest data state (L15). Under the influence of the hot carrier injection effect, the threshold voltage of the memory cell coupled to the word line WL1 and in the lowest data state (L0) shifts toward the positive direction, so that the loss of the first readable distribution E0 corresponding to the memory cell coupled to the word line WL1 and in the non-selected string is relatively serious.

Figure 11:
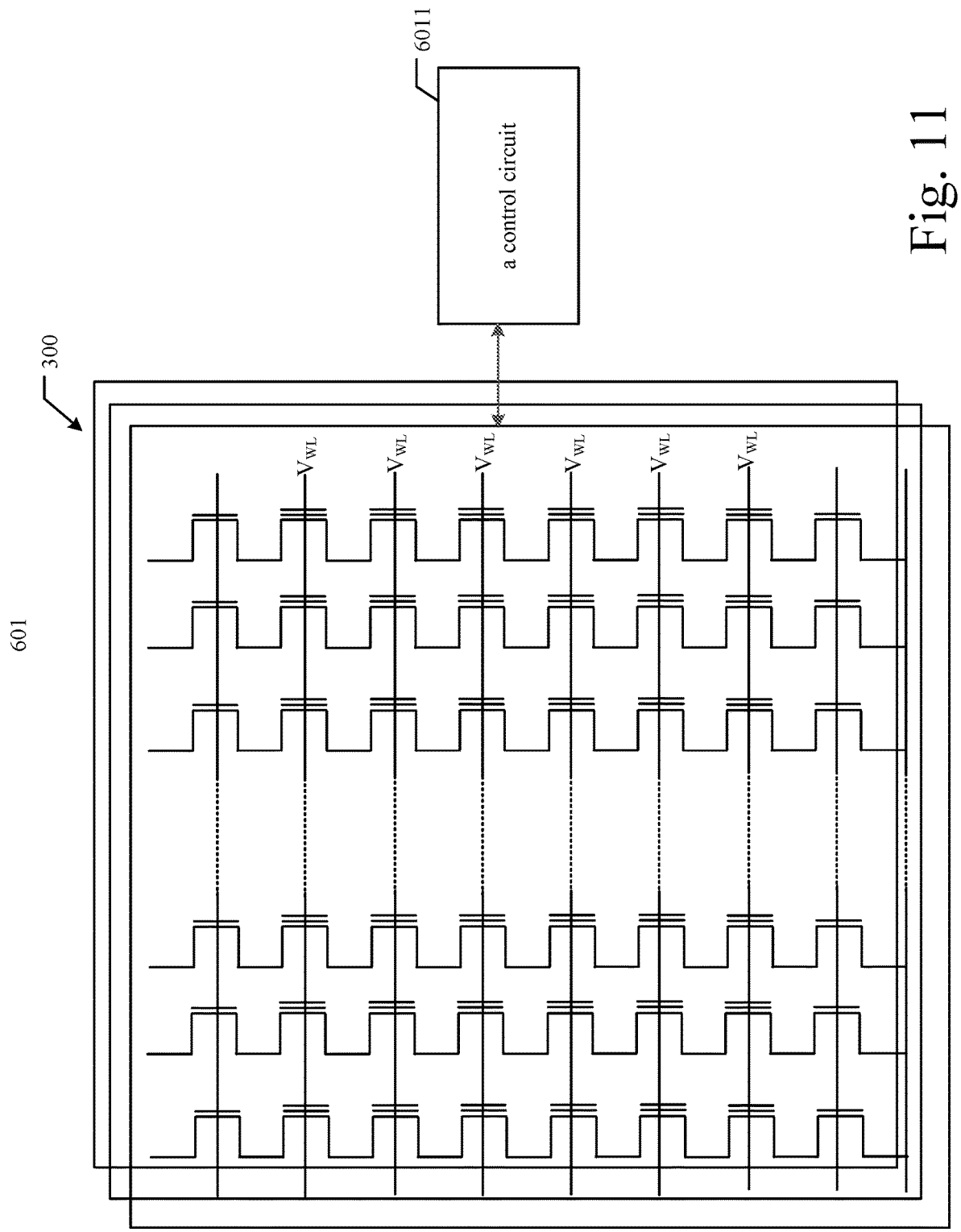
FIG. 11 is a schematic diagram of a structure of a memory device provided according to an implementation of the present disclosure.

In order to solve the above technical problems, as shown in FIG. 11, an implementation of the present disclosure provides a memory device 601 including:

a memory array 300, the memory array comprises a plurality of memory blocks, each memory block includes a plurality of memory cell strings, and each memory cell string includes a top dummy cell, a plurality of memory cells and a bottom dummy cell connected in series, wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line; and a control circuit 6011 coupled to the memory array and used to control the memory array;

the control circuit 6011 is configured to:

determine a first average value of threshold voltages of bottom dummy cells in an unused memory block;

determine a difference value between the first average value and a first reference value;

judge based on the difference value when bottom dummy cells in the memory block are to be programmed so that the first average value reaches a first threshold;

wherein the first threshold is used to make a potential difference between an edge word line and an adjacent non-edge word line to be reduced when programming a memory cell coupled to a selected non-edge word line, the edge word line is at least one word line of the plurality of word lines which is adjacent to the source line, the non-edge word line is a word line of the plurality of word lines except for the edge word line, and the selected non-edge word line is not adjacent to the edge word line.

It should be noted that the memory devices described in the foregoing FIGS. 1 to 7 are only used to exemplarily illustrate a part of connection relationships and a part of working principles among memory cell strings, memory blocks, memory sub-blocks, word lines, bit lines, etc. included in the memory device, but not used to limit the present disclosure. That is to say, the memory device 601 described in the implementation of the present disclosure may be the structures described in FIG. 1 to 7, or may be structures of other implementations with similar functions. In some implementations, the plurality of word lines may all be included in the first stack; the first stack may further include dielectric layers alternately laid with the word lines, that is, the first stack may be word lines and dielectric layers alternately laid. In some implementations, the material used for the plurality of word lines can be any of the above-described word line materials, and the material used for the dielectric layer can be any of the material used for the above-described dielectric layer.

In some implementations, based on the foregoing description, since etching a plurality of word line layers mixed with dielectric layers is expensive and/or challenging, to alleviate this burden, memory devices provided by implementations of the present disclosure may also include the plurality of word lines in the first stack and the second stack, and connect the first stack and the second stack using a bonding region, wherein the material of the bonding region can be the same as the material used for the word lines. In some implementations, the numbering of word lines in the first stack is less than the numbering of word lines in the second stack. In some implementations, the numbering of word lines in the first stack is greater than the numbering of word lines in the second stack.

In some implementations, the selected non-edge word lines in the memory device provided according to the implementations of the present disclosure may be in the first stack or in the second stack.

In some implementations, the memory array in the memory device provided according to the implementations of the present disclosure may be a three-dimensional NAND memory array, or may be other 3D memory arrays.

In the technical solutions described above, the division of an edge word line and a non-edge word line is not static, and the two are relative concepts. In other words, for different memory devices 601, the defined edge word line and non-edge word line are different. In some implementations, how to define an edge word line and a non-edge word line depends on the severity of hot carrier injection influence among word lines in the memory device (determined by the loss of E0). A determination way can be: word lines that are relatively seriously affected by hot carrier injection and the word lines below are defined as edge word lines; word lines that are not seriously affected by hot carrier injection and the word lines above are defined as non-edge word lines. For example, in some memory devices 601, it is defined that edge word lines include WL0 and WL1 (with a memory array of the structure shown in FIG. 5B), then at this time, non-edge word lines include WL2 and the word lines above. For another example, the edge word lines defined in some memory devices 601 include WL0, WL1, and WL2, then at this time, the non-edge word lines include WL3 and the word lines above.

Figure 12:
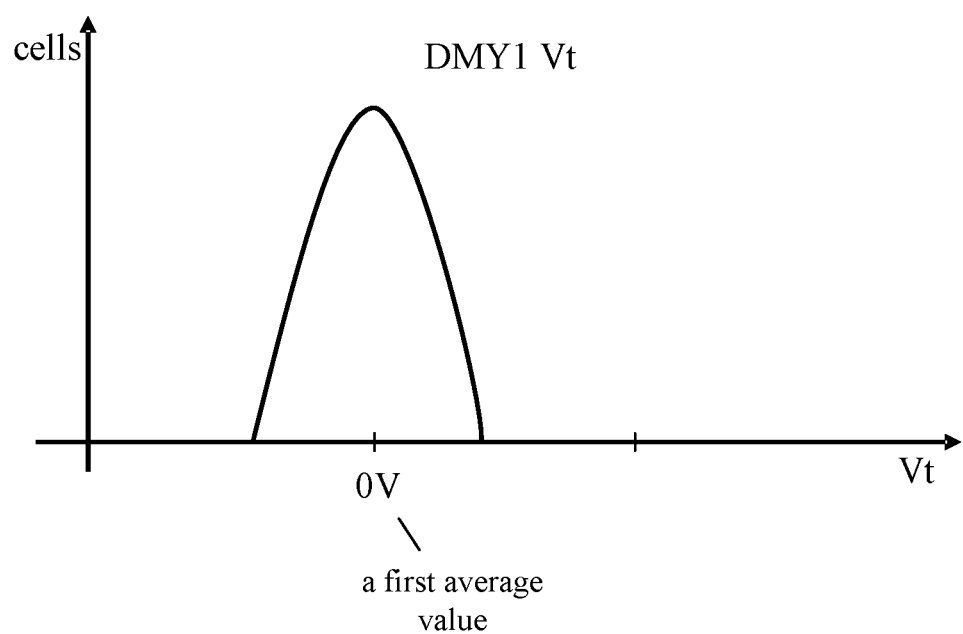
FIG. 12 is a schematic diagram of a first average value of threshold voltages of bottom dummy cells provided according to an implementation of the present disclosure.

Here, the unused memory block may refer to a new memory block that has never been used, because the corresponding threshold voltage of the bottom dummy cell has been set before the new memory block is programmed for the first time, and when the memory block is subsequently programmed, the threshold voltage on the bottom dummy cell is generally unchanged. Therefore, the implementations of the present disclosure provide a memory device that can modify the threshold voltages on the bottom dummy cells for a new memory block that has never been used. The first average value of the threshold voltages of the bottom dummy cells may refer to the average value of the threshold voltages of all the bottom dummy cells on the bottom dummy word line. Those skilled in the art should understand that, during a practical application course, there are several, dozens, or even tens of thousands of bottom dummy cells coupled on the bottom dummy word line, each bottom dummy cell has its own threshold voltage, and then the threshold voltages of so many bottom dummy cells are added, and then divided by the total number of the bottom dummy cells, thus the first average value of the threshold voltages of the bottom dummy cells can be obtained. Referring to FIG. 12, in FIG. 12, the abscissa is the threshold voltage and the ordinate is the number of bottom dummy cells. It should be noted that the memory cells are essentially the aforementioned transistors for storing user data, the bottom dummy cells are essentially the aforementioned bottom dummy transistors, and the top dummy cells are essentially the aforementioned top dummy transistors.

Therefore, the above technical solution can be understood as detecting the first average value of the threshold voltages on the bottom dummy cells coupled to the bottom dummy word line and included in the new memory block that has never been used, and then comparing the first average value with the first reference value by obtaining their difference; and then based on this difference value, judging if the bottom dummy cells are to be programmed to a first threshold (i.e., a first threshold), under the first threshold, when the memory cells coupled to a selected non-edge word line of the plurality of word lines being programmed, the potential difference between the edge word line and an adjacent non-edge word line is reduced, so that HCI type program disturb can be avoided.

For example, with the memory array of the structure shown in FIG. 5B as an example, when the edge word lines include word lines WL0 and WL1, the non-edge word lines include word lines WL2 and above, and when the memory cells coupled to the word line WL1 and above are QLC type memory cells, the memory device provided according to the implementation of the present disclosure, when programming the memory cells coupled to the non-edge word line WL3 and any above word line (the selected non-edge word line), can make the potential difference between WL2 (a non-edge word line adjacent to an edge word line) and the word line WL1 (an edge word line adjacent to a non-edge word line) reduced after Vpass is applied, thereby reducing the influence on the first reading distribution E0 of the memory cells of an unselected string coupled to the word line WL1.

Here, the first reference value may be a threshold voltage that is not affected by operations in the memory device, wherein the operations may be any operations on the memory device such as programming, reading, erasing, and the like.

As an implementation, the first reference value is a second average value of threshold voltages of top dummy cells in the memory block.

It should be noted that the calculation way of the second average value of the threshold voltages of the top dummy cells here is similar to the calculation way of the first average value of the first threshold voltages described above, and will not be repeated here.

Based on this, in some implementations, the judging based on the difference value when bottom dummy cells in the memory block are to be programmed so that the first average value reaches a first threshold may comprise:

when the difference value is less than a second reference value, deciding that bottom dummy cells in the memory block need to be programmed so that the first average value reaches the first threshold, wherein a difference value between the first threshold and the first reference value is not less than the second reference value;

when the difference value between the first average value and the first reference value is not less than the second reference value, deciding that the bottom dummy cells in the memory block need not to be programmed.

It is described here that, when the first reference value is an average value of threshold voltages on top dummy cells coupled to the top dummy word line, referred to as the second average value, when the difference value is less than a second reference value, the bottom dummy cells need to be programmed so that the first average value of the threshold voltages of the bottom dummy cells reaches the first threshold, and the difference value between the first threshold and the first reference value is not less than the second reference value, that is, the threshold voltages on the bottom dummy cells are raised, and the difference value from the first reference value is not less than another second reference value. When the difference value between the first average value and the first reference value is not less than the second reference value, it is not necessary to program the bottom dummy cells so that the first average value of the threshold voltages of the bottom dummy cells reaches the first threshold. In some implementations, the second reference value may be determined according to the type of the actual memory array and the model of chip used, for example, the second reference value may be 1 volt (V), 0.5V, and so on.

During a practical application course, the second average value is 0 volts, that is, the first reference value may be 0 volts (V). In this case, the judging based on the difference value when bottom dummy cells in the memory block are to be programmed so that the first average value reaches a first threshold may comprise:

when the difference value is not more than the first reference value, deciding that bottom dummy cells in the memory block need to be programmed so that the first average value reaches the first threshold, wherein the first threshold is more than the first reference value;

when the difference value is more than the first reference value, deciding that bottom dummy cells in the memory block need not to be programmed.

It should be noted that the first threshold may be determined according to the type of the actual memory array and the model of the chip used, for example, the first threshold may be 0.5 volts (V), 1V, etc., wherein the higher the first threshold, the lower the chance of preventing HCI type program disturb. It should be understood that the first threshold is also the average value of the threshold voltages of the bottom dummy cells coupled to the bottom dummy word line.

According to the above description, the setting of the bottom dummy cells may be performed before programming the memory cells coupled to the word lines WL0 to WLN−1 in the new unused memory block that has never been used. Then, based on this, in some implementations, thereinto, the control circuit is further configured to: when programming a memory cell in the selected memory cell string and coupled to a selected non-edge word line, apply a first pass voltage to an edge word line of the plurality of word lines and apply a second pass voltage to a non-edge word line adjacent to the edge word line, wherein the first pass voltage is less than the second pass voltage.

It should be noted that, the technical solution described here is: after the first average value of the threshold voltages of the bottom dummy cells reaches the first threshold, by applying a first pass voltage to the edge word line of the plurality of word lines and applying a second pass voltage to the non-edge word line adjacent to the edge word line, wherein the first pass voltage is not more than the second pass voltage, thereby the potential difference that exists between the edge word line and its adjacent non-edge word line is further reduced, in turn, reducing the influence on E0 of a memory cell coupled to the edge word lines adjacent to the non-edge word lines (e.g., the word line WL1).

Figure 13:
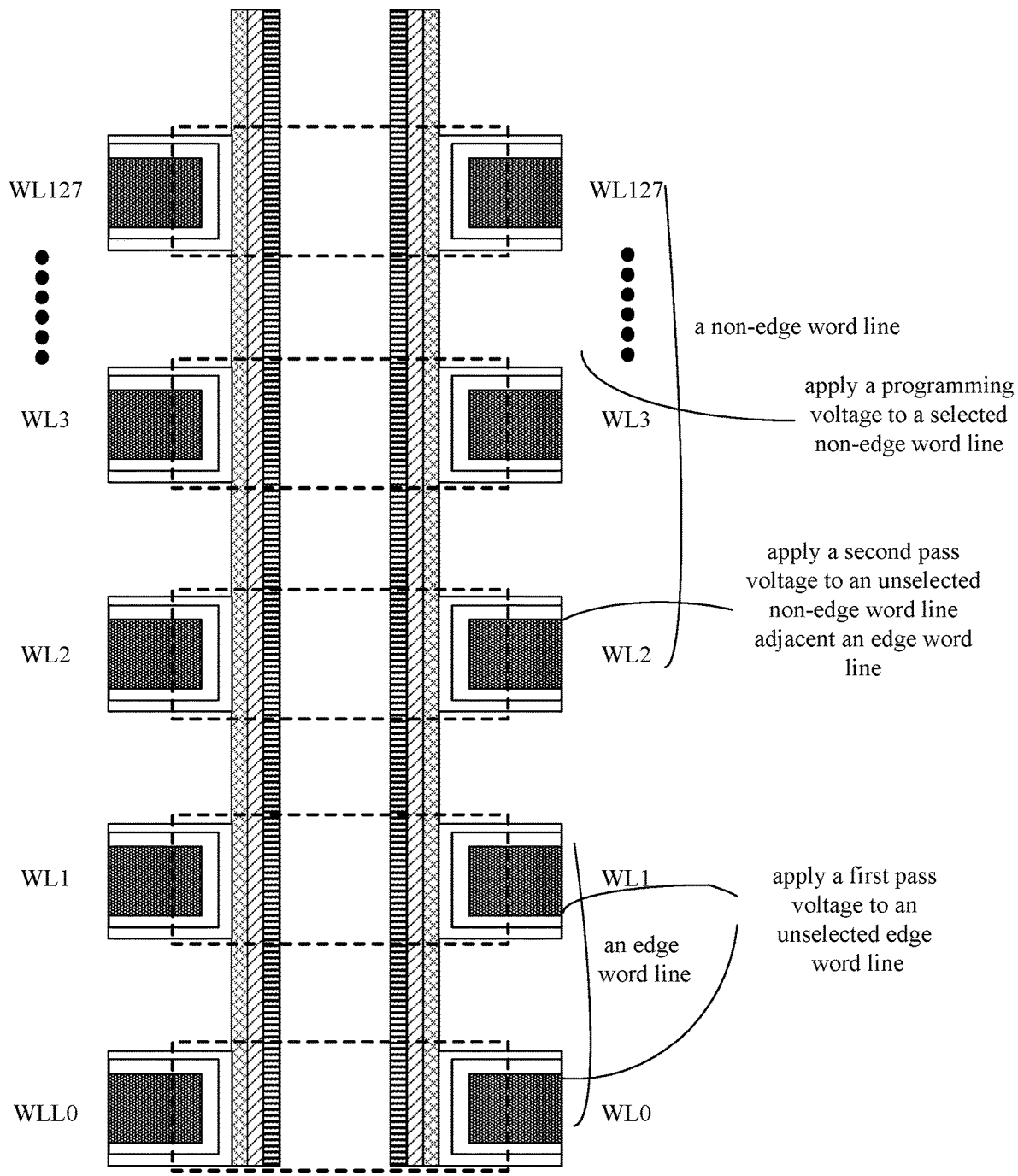
FIG. 13 is a schematic diagram of an implementation of applying a programming voltage and a pass voltage when programming a memory device provided according to an implementation of the present disclosure.

For example, with the memory array of the structure shown in FIG. 5B as an example, when the edge word lines include word lines WL0 and WL1, the non-edge word lines include word lines WL2 and above, and the memory cells coupled to the word line WL1 and a word line above are QLC type memory cells, the memory device provided according to the implementation of the present disclosure, when, after programming the threshold voltages of the bottom dummy cells so that the first average value of the threshold voltages of the bottom dummy cells reaches a first threshold, programming the memory cells coupled to the non-edge word line WL3 and any word line above, a first pass voltage may be applied to the word lines WL0 and WL1 and a second pass voltage may be applied to the word line WL2, thus the potential difference between the word line WL2 and the word line WL1 is reduced, thereby reducing the influence on the first reading distribution of the memory cells of an unselected string coupled to the word line WL1. For details, please refer to FIG. 13 shown.

In some implementations, the first pass voltages applied to each of the edge word lines may be different.

For example, for the aforementioned edge word lines WL0 and WL1, the first pass voltage applied to the word line WL0 is different from the first pass voltage applied to the word line WL1, but both are less than the second pass voltage. That is, the first pass voltage may be a set of voltage values less than the second pass voltage. In some implementations, in order to reduce the potential difference existing between the edge word lines, the closer to the substrate the edge word line is, the smaller the first pass voltage applied is, for example, for the aforementioned edge word lines WL0 and WL1, the first pass voltage applied on the word line WL0 is less than the first pass voltage applied on the word line WL1.

In some implementations, when the plurality of word lines are sequentially numbered from the source line as word lines WL0, WL1, ..., WLm, ..., WLn, ..., the control circuit is further configured to: when the edge word line includes the word line WL0 and the word line WL1 and the selected non-edge word line is the word line WLn, apply the second pass voltage to an unselected non-edge word line WL2 to the word line WLm and apply a third pass voltage to an unselected non-edge word line WLn−4 to the word line WLm, wherein n is not less than 17 and m is not more than 15.

It should be noted that the above is to reduce program disturb caused by pass voltages applied between other non-edge word lines when programming memory cells coupled to the non-edge word lines WL17 and the word line above.

In some implementations, the third pass voltage includes a set of voltage values different from the first pass voltage and the second pass voltage.

It should be noted that the third pass voltage may be a set of voltage values different from the first pass voltage and the second pass voltage, that is, according to the specific memory device, different pass voltages are applied to the word lines from the unselected non-edge word line WLn−4 to the word line WLm.

When the memory device is a 3D NAND memory device, in order to ensure the reading and writing speed partly, in some implementations, the memory cells coupled to the word line WL0 are one of a single-level cell SLC memory cell, a multi-level cell MLC memory cell, or a three-level cell TLC memory cell, and the memory cells coupled to the remaining word lines are four-level cell QLC memory cells. In some other implementations, in order to ensure storage capacity, each memory cell coupled to the plurality of word lines is configured as one of a multi-level cell MCL memory cell, a TLC memory cell, a QLC memory cell, or a five-level cell PLC memory cell. This is only a part of the example setting ways, and the specific setting can be determined according to customer requirements.

In a memory device provided according to an implementation of the present disclosure, by comparing the threshold voltage of the bottom dummy cell coupled to the bottom dummy word line in the memory device with a reference value, it is judged if the threshold voltages of the bottom dummy cells coupled to the bottom dummy word lines in the memory device need to be programmed to a target value (i.e., the first threshold) at which the potential difference between an edge word line (e.g., the word line WL1) and a non-edge word line (e.g., the word line WL2) which are adjacent is reduced, thereby reducing HCI type disturb on an edge word line (e.g., the word line WL1) during programming of a non-edge word line (e.g., the word line WL3), thus reducing the influence on read window margin.

Figure 14:
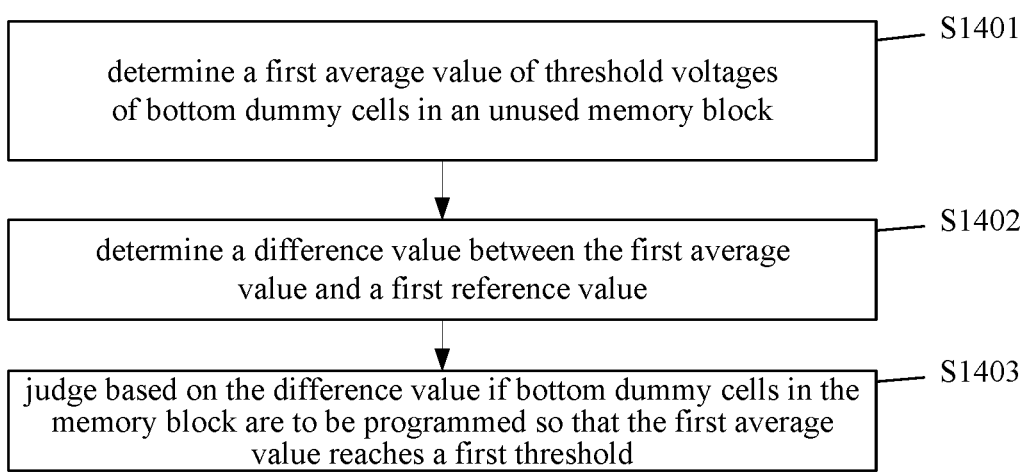
FIG. 14 is a schematic flowchart of a method for programming a memory device provided according to an implementation of the present disclosure.

With the same inventive concept aforementioned, as shown in FIG. 14, the present disclosure also provides an operation method of a memory device, the memory device includes a memory array, the memory array comprises a plurality of memory blocks, each memory block includes a plurality of memory cell strings, and each memory cell string includes a top dummy cell, a plurality of memory cells and a bottom dummy cell connected in series; wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line; the operation method comprises:

S1401: determining a first average value of threshold voltages of bottom dummy cells in an unused memory block;

S1402: determining a difference value between the first average value and a first reference value;

S1403: judging based on the difference value when bottom dummy cells in the memory block are to be programmed so that the first average value reaches a first threshold;

wherein the first threshold is used to make a potential difference between an edge word line and an adjacent non-edge word line to be reduced when programming a memory cell in a selected memory cell string and coupled to a selected non-edge word line, the edge word line is at least one word line of the plurality of word lines which is adjacent to the source line, the non-edge word line is a word line of the plurality of word lines except for the edge word line, and the selected non-edge word line is not adjacent to the edge word line.

In some implementations, the first reference value is a second average value of threshold voltages of top dummy cells in the memory block.

In some implementations, the judging based on the difference value when bottom dummy cells in the memory block are to be programmed so that the first average value reaches a first threshold comprises:
when the difference value is less than a second reference value, deciding that bottom dummy cells in the memory block need to be programmed so that the first average value reaches the first threshold, wherein a difference value between the first threshold and the first reference value is not less than the second reference value;
when the difference value between the first average value and the first reference value is not less than the second reference value, deciding that bottom dummy cells in the memory block need not to be programmed.

In some implementations, wherein the second average value is 0 volts.

In some implementations, the judging based on the difference value when bottom dummy cells in the memory block are to be programmed so that the first average value reaches a first threshold comprises:
when the difference value is not more than the first reference value, deciding that bottom dummy cells in the memory block need to be programmed so that the first average value reaches the first threshold, wherein the first threshold is more than the first reference value;
when the difference value is more than the first reference value, deciding that bottom dummy cells in the memory block need not to be programmed.

In some implementations, the operating method further comprises:
when programming a memory cell in the selected memory cell string and coupled to a selected non-edge word line, applying a first pass voltage to an edge word line of the plurality of word lines and applying a second pass voltage to a non-edge word line adjacent to the edge word line, wherein the first pass voltage is smaller than the second pass voltage.

In some implementations, when the plurality of word lines are sequentially numbered from the source line as word lines WL0, WL1, . . . , WLm, . . . , WLn, . . . , the operation method further comprises: when the edge word line includes the word line WL0 and the word line WL1 and the selected non-edge word line is the word line WLn, applying the second pass voltage to an unselected non-edge word line WL2 to the word line WLm and applying a third pass voltage to an unselected non-edge word line WLn−4 to the word line WLm, wherein n is not less than 17 and m is not more than 15.

In some implementations, the third pass voltage includes a set of voltage values different from the first pass voltage and the second pass voltage.

In some implementations, the memory cells coupled to the word line WL0 are one of a single-level cell SLC memory cell, a multi-level cell MLC memory cell, or a three-level cell TLC memory cell, and the memory cells coupled to the remaining word lines are four-level cell QLC memory cells.

In some implementations, each memory cell coupled to a non-edge word line of the plurality of word lines is one of a multi-level cell MCL memory cell, a TLC memory cell, a QLC memory cell, or a five-level cell PLC memory cell.

It should be noted that this method and the aforementioned memory device belong to the same inventive concept, and the terms appearing in this method are all explained in detail in the aforementioned memory device, which are also applicable here, and will not be elaborated one by one.

Figure 15:
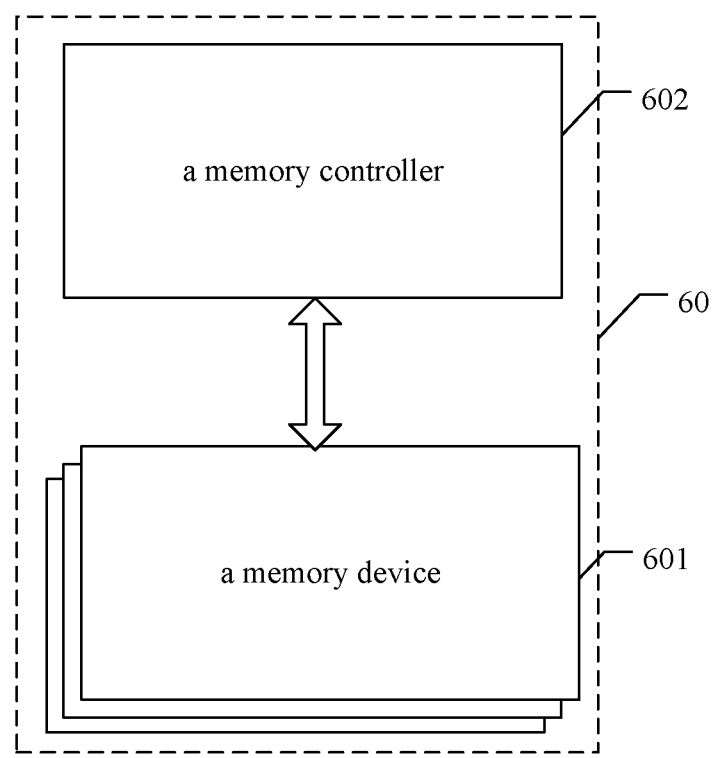
FIG. 15 is a schematic diagram of a structure of a memory system provided according to an implementation of the present disclosure.

Based on the same inventive concept aforementioned, as shown in FIG. 15, an implementation of the present disclosure further provides a memory system, comprising:

a memory device, the memory device includes:
a memory array, the memory array comprises a plurality of memory blocks, each memory block includes a plurality of memory cell strings, and each memory cell string includes a top dummy cell, a plurality of memory cells and a bottom dummy cell connected in series; wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line;
a control circuit coupled to the memory array and used to control the memory array, wherein the control circuit is configured to: determine a first average value of threshold voltages of bottom dummy cells in an unused memory block; determine a difference value between the first average value and a first reference value; judge based on the difference value when bottom dummy cells in the memory block are to be programmed so that the first average value reaches a first threshold; wherein the first threshold is used to make a potential difference between an edge word line and an adjacent non-edge word line to be reduced when programming a memory cell coupled to a selected non-edge word line, the edge word line is at least one word line of the plurality of word lines which is adjacent to the source line, the non-edge word line is a word line of the plurality of word lines except for the edge word line, and the selected non-edge word line is not adjacent to the edge word line; and
a memory controller 602 coupled to the memory device, wherein the memory controller is configured to control the memory device.

Figure 16A:
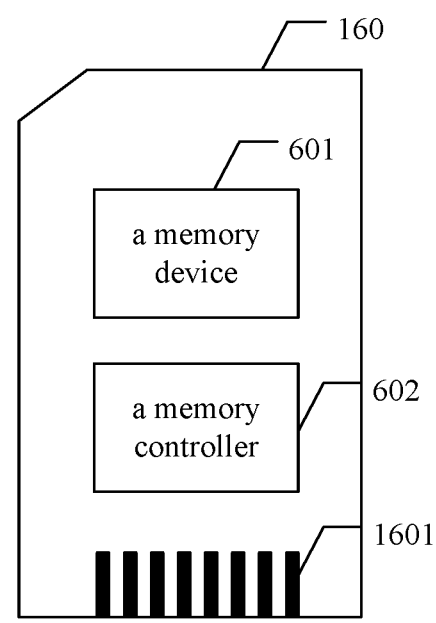
FIG. 16A is a schematic diagram of an exemplary memory card with a memory system according to some aspects of the present disclosure.
Figure 16B:
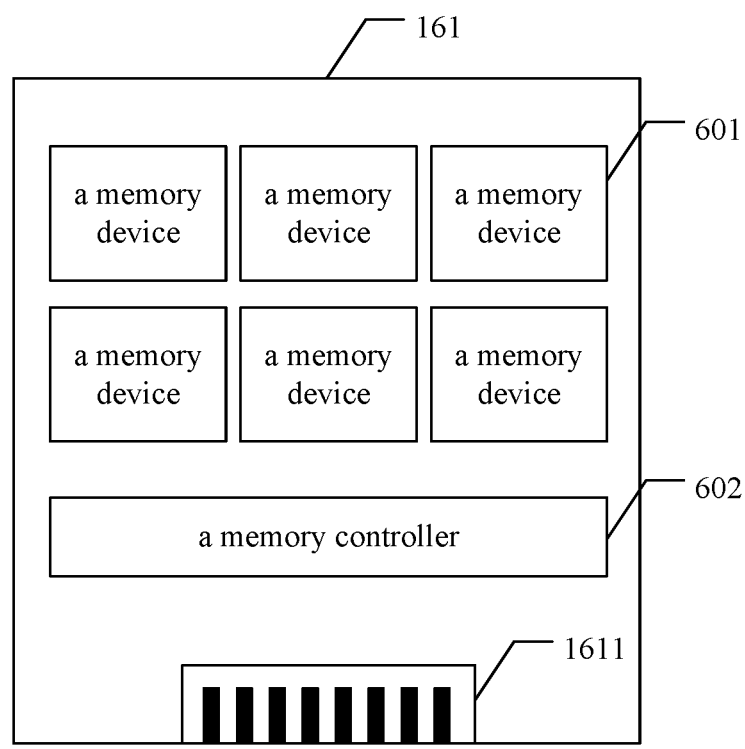
FIG. 16B is a schematic diagram of an exemplary solid state drive (SSD) with a memory system according to some aspects of the present disclosure.

It should be noted that the memory system 60 can communicate with the host in the aforementioned FIG. 6. Thereinto, the host and/or the memory system 60 may be included in various products, such as Internet of Things (IoT) devices, such as refrigerators or other devices, sensors, motors, mobile communication devices, automobiles, unmanned vehicles, etc., used to support the processing, communication, or control of the products. In an implementation, the memory system 60 may be a discrete memory or memory component of a host device. In some other implementations, the memory system 60 may also be a part of an integrated circuit, e.g., a part of a system on chip (SOC). In this case, the memory system 60 is stacked or otherwise assembled together with one or more components of the host. In some other implementations, the aforementioned memory system can be implemented and packaged in products such as memory cards, drives, etc., as shown in FIG. 16A and FIG. 16B, wherein FIG. 16A shows a schematic diagram of an exemplary memory card with a memory system in accordance with some aspects provided by the present disclosure and FIG. 16B shows a schematic diagram of an exemplary solid state drive (SSD) with a memory system in accordance with some aspects of the present disclosure. In one example as shown in FIG. 16A, a single memory device 601 and a memory controller 602 of the memory system may be integrated into the memory card 160. The memory card 160 may comprise a PC card (PCMCIA, Personal Computer Memory Card International Association), a CF card, a smart media (SM) card, a memory stick, a multimedia card (MMC, RS-MMC, MMCmicro), a SD card (SD, miniSD, microSD, SDHC), UFS, etc. The memory card 160 may also comprise a memory card connector 1601 that couples the memory card 160 with a host (e.g., the host in FIG. 6). In another example as shown in FIG. 16B, a memory controller 602 and a plurality of memory devices 601 may be integrated into the SSD 161. SSD 161 may also comprise an SSD connector 1611 that couples SSD 161 with a host (e.g., the host in FIG. 6). In some implementations, the storage capacity and/or operation speed of SSD 161 is greater than the storage capacity and/or operation speed of the memory card 160.

In some implementations, the host may comprise a processor and a host RAM, where the host RAM may comprise DRAM, SDRAM, or any other suitable volatile or non-volatile memory device. One or more communication interfaces may be provided on the memory system 60 to communicate with one or more components in the host. One or more components in the host may be the Serial Advanced Technology Attachment (SATA) interface, Peripheral Component Interconnect Express (PCIe) interface, Universal Serial Bus (USB) interface, Universal Flash Storage (UFS) interface, eMMCTM interface, etc. The host may also comprise electronic elements, a memory card reader, or one or more other electronic elements external to the memory system 60.

In some implementations, the memory controller 602 may receive instructions from the host to communicate with the memory devices 601, such as the memory controller 602 transferring data to one or more memory cells, planes, sub-blocks, blocks, or pages of the memory devices 601 by executing writing or erasing instructions, or the memory controller 602 transferring data to the host by executing a reading instruction. With respect to hardware, the memory controller 602 may comprise one or more controller units, circuits, or components, be configured to control access across the memory device 601 and provide a translation layer between the host and the memory system 60. The memory controller 602 may also comprise one or more input/output (I/O) circuits, lines, or interfaces to transfer data to and from the memory device 601. The memory controller 602 may also comprise a memory management unit and an array control unit.

The memory management unit may comprise circuit hardware or firmware, such as a plurality of components or integrated circuits associated with various memory management functions. Take a NAND memory as an example for memory system operation or management functions. Those skilled in the art will appreciate that other forms of non-volatile memory may have similar memory operation or management functions. Thereinto, the management functions of the NAND memory may comprise wear leveling, such as garbage collection or reclamation, error detection or correction, block retirement, or one or more other memory management functions. The memory management unit may process the host's instructions into commands recognizable by the memory system 60, for example, parse or format the instructions received from the host into commands related to the operation of the memory device 601, etc.; or the memory management unit may also generate device commands for the array control unit or one or more other components of the memory system 60, e.g., commands to implement various memory management functions.

The memory management unit may be configured to include a set of management tables for maintaining various information associated with one or more components of the memory system 60, e.g., various information related to a memory array coupled to the memory controller 602, or one or more memory cells, for example, the management tables may include information such as a block age, block erasing counts, error history, or one or more error counts and the like, of one or more blocks of the memory cells coupled to the memory controller 602. Thereinto, the error count may comprise an operation error count, a read bit error count, and the like. In some implementations, a bit error is an uncorrectable bit error in the case that the detected error count is above a certain threshold. In some implementations, the management table may maintain a count of correctable or uncorrectable bit errors, or the like. The management table may also include one or more L2P tables, which include one or more L2P pointers associated with the physical addresses at the memory device 601 using logical addresses. In some implementations, the management tables may include unencrypted L2P tables and/or encrypted L2P tables. The unencrypted L2P table may comprise L2P pointers indicating unencrypted logical addresses and unencrypted physical addresses; the encrypted L2P table may include encrypted L2P pointers of encrypted physical addresses and unencrypted logical addresses. During a practical application course, the management table may be shown in the memory management unit, that is, the management table may be stored in the RAM of the memory controller 602. In some other implementations, the management table may also be stored in the memory device 601. When in use, the memory management unit can read part or all of the buffered management tables from the RAM of the memory controller 602; the management table can also be read from the memory device 601.

The array control unit may include circuitry or components and be configured to complete the following related memory operations, for example, the array control unit controls the writing of data into one or more memory cells in the memory system 60 coupled to the memory controller 602, the reading of data from the one or more memory cells, or the erasing of the one or more memory cells. The array control unit may receive a command sent by the host, or a host command internally generated by the memory management unit, and the host command may be a command associated with wear leveling, error detection or correction, and the like.

The array control unit may also comprise an error correction code (ECC) component, which may include an ECC engine or other circuitry for detecting or correcting the following related errors which are errors that may occur in the process of writing dada into or reading data from one or more memory cells in the memory system 60 coupled to the memory controller 602. The memory controller 602 is configured to efficiently detect and recover from error events associated with various operations or data storage, such as bit errors, operation errors, etc., while maintaining an integrity of data transferred between the host and the memory systems 60, or maintaining an integrity of stored data, for example, redundant RAID storage and the like may be used and failed memory resources, such as memory cells, memory arrays, pages, blocks, etc., may be removed, e.g., retired, to prevent future errors.

In some implementations, the first reference value is a second average value of threshold voltages of top dummy cells in the memory block.

In some implementations, the control circuit is further configured to: when programming a memory cell in the selected memory cell string and coupled to a selected non-edge word line, apply a first pass voltage to an edge word line of the plurality of word lines and apply a second pass voltage to a non-edge word line adjacent to the edge word line, wherein the first pass voltage is smaller than the second pass voltage.

In some implementations, the plurality of word lines are all included in the first stack; the first stack further includes dielectric layers alternately laid with the word lines.

In some implementations, the plurality of word lines are included in a first stack and a second stack, wherein the numbering of word lines in the first stack is less than the numbering of word lines in the second stack.

In some implementations, the selected non-edge word line is in the first stack or in the second stack.

In some implementations, the memory array is a three-dimensional NAND memory array.

It should be noted that the memory system includes the aforementioned memory device, therefore, the two have the same technical features. The terms appearing in the memory system are all explained in detail in the aforementioned memory device, which are also applicable here, and will not be elaborated one by one.

The above description is intended to be illustrative, not restrictive. For example, the above examples (or one or more aspects thereof) may be used in combination with each other. Other implementations may be used, such as those that can be used by those of ordinary skill in the art upon reading the above description. It should be understood that it will not be used to interpret or limit the scope or meaning of the claims. Furthermore, in the above detailed description, various features may be combined together to simplify the disclosure. This should not be interpreted as implying that an unclaimed disclosed feature is essential to any claim. Rather, a disclosed subject matter may lie in less than all features of a particular disclosed implementation. Thus, the following claims are hereby incorporated into the detailed description, with each claim standing on its own as a separate implementation, and it is contemplated that these implementations may be combined with each other in various combinations and permutations. The scope of the present disclosure should be determined with reference to the appended claims, along with the full scope of equivalents to which such claims are entitled.

The invention claimed is:

1. A memory device, comprising:
a memory array, wherein the memory array comprises a plurality of memory blocks, each memory block includes a plurality of memory cell strings, and each memory cell string includes a top dummy cell, a plurality of memory cells, and a bottom dummy cell connected in series, wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line; and
a control circuit coupled to the memory array and used to control the memory array, wherein the control circuit is configured to:

determine a first average value of threshold voltages of bottom dummy cells in an unused memory block;

determine a difference value between the first average value and a first reference value; and based on the difference value, program the bottom dummy cells in the memory block to raise the first average value to a first threshold, such that a potential difference between an edge word line and an adjacent non-edge word line is reduced when programming a memory cell coupled to a selected non-edge word line, wherein the edge word line is at least one word line of the plurality of word lines which is adjacent to the source line, the non-edge word line is a word line of the plurality of word lines except for the edge word line, and the selected non-edge word line is not adjacent to the edge word line.

2. The memory device according to claim 1, wherein the first reference value is a second average value of threshold voltages of top dummy cells in the memory block.

3. The memory device according to claim 2, wherein before to program the bottom dummy cells in the memory block, the control circuit is configured to judge, based on the difference value, whether the bottom dummy cells in the memory block need to be programmed to raise the first average value to the first threshold, the control circuit is further configured to:

when the difference value is less than a second reference value, decide that the bottom dummy cells in the memory block need to be programmed to raise the first average value to the first threshold, wherein the difference value between the first threshold and the first reference value is not less than the second reference value; and when the difference value between the first average value and the first reference value is not less than the second reference value, decide that the bottom dummy cells in the memory block need not to be programmed.

4. The memory device according to claim 2, wherein the second average value is 0 volt.

5. The memory device according to claim 4, wherein before to program the bottom dummy cells in the memory block, the control circuit is configured to judge based on the difference value, whether the bottom dummy cells in the memory block need to be programmed to raise the first average value a to the first threshold, the control circuit is further configured to:

when the difference value is not more than the first reference value, decide that the bottom dummy cells in the memory block need to be programmed to raise the first average value to the first threshold, wherein the first threshold is more than the first reference value; and when the difference value is more than the first reference value, decide that the bottom dummy cells in the memory block need not to be programmed.

6. The memory device according to claim 1, wherein the control circuit is further configured to, when programming the memory cell coupled to the selected non-edge word line: apply a first pass voltage to an edge word line of the plurality of word lines and apply a second pass voltage to a non-edge word line adjacent to the edge word line, wherein the first pass voltage is less than the second pass voltage.

7. The memory device according to claim 6, when the plurality of word lines are sequentially numbered from the source line as word lines WL0, WL1, . . . , WLm, . . . , WLn, . . . , the control circuit is further configured to, when the edge word line includes the word line WL0 and the word line WL1, and the selected non-edge word line is the word line WLn:

apply the second pass voltage to an unselected non-edge word line WL2 to the word line WLm; and apply a third pass voltage to an unselected non-edge word line WLn−4 to the word line WLm, wherein n is not less than 17 and m is not more than 15.

8. The memory device according to claim 7, wherein the third pass voltage comprises a set of voltage values different from the first pass voltage and the second pass voltage.

9. The memory device according to claim 7, wherein memory cells coupled to the word line WL0 are one of a single-level cell SLC memory cell, a multi-level cell MLC memory cell, or a three-level cell TLC memory cell; and memory cells coupled to the remaining word lines are four-level cell QLC memory cells.

10. An operation method of a memory device, wherein the memory device comprises a memory array, the memory array comprises a plurality of memory blocks, each memory block includes a plurality of memory cell strings, and each memory cell string includes a top dummy cell, a plurality of memory cells, and a bottom dummy cell connected in series, wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line, the operation method comprises:

determining a first average value of threshold voltages of the bottom dummy cells in an unused memory block;

determining a difference value between the first average value and a first reference value; and based on the difference value, programming the bottom dummy cells in the memory block to raise the first average value to a first threshold, such that a potential difference between an edge word line and an adjacent non-edge word line is reduced when programming a memory cell in a selected memory cell string and coupled to a selected non-edge word line, wherein the edge word line is at least one word line of the plurality of word lines which is adjacent to the source line, the non-edge word line is a word line of the plurality of word lines except for the edge word line, and the selected non-edge word line is not adjacent to the edge word line.

11. The operation method according to claim 10, wherein the first reference value is a second average value of threshold voltages of top dummy cells in the memory block.

12. The operation method according to claim 11, wherein before programming the bottom dummy cells in the memory block, the operation method further comprises judging based on the difference value, whether the bottom dummy cells in the memory block need to be programmed to raise the first average value a to the first threshold, comprises:

when the difference value is less than a second reference value, deciding that the bottom dummy cells in the memory block need to be programmed to raise the first average value to the first threshold, wherein the difference value between the first threshold and the first reference value is not less than the second reference value; and when the difference value between the first average value and the first reference value is not less than the second reference value, deciding that the bottom dummy cells in the memory block need not to be programmed.

13. The operation method according to claim 11, wherein the second average value is 0 volt.

14. The operation method according to claim 13, wherein before programming the bottom dummy cells in the memory block, the operation method further comprises judging based on the difference value, whether the bottom dummy cells in the memory block need to be programmed to raise the first average value to the first threshold, comprises:
when the difference value is not more than the first reference value, deciding that the bottom dummy cells in the memory block need to be programmed to raise the first average value to the first threshold, wherein the first threshold is more than the first reference value; and
when the difference value is more than the first reference value, deciding that the bottom dummy cells in the memory block need not to be programmed.

15. The operation method according to claim 10, wherein the operation method further comprises:
when programming the memory cell in the selected memory cell string and coupled to a selected non-edge word line, applying a first pass voltage to an edge word line of the plurality of word lines and applying a second pass voltage to a non-edge word line adjacent to the edge word line, wherein the first pass voltage is less than the second pass voltage.

16. The operation method according to claim 15, when the plurality of word lines are sequentially numbered from the source line as word lines WL0, WL1, ..., WLm, ..., WLn, ..., the operation method further comprises, when the edge word line includes the word line WL0 and the word line WL1, and the selected non-edge word line is the word line WLn:
applying the second pass voltage to an unselected non-edge word line WL2 to the word line WLm; and
applying a third pass voltage to an unselected non-edge word line WLn−4 to the word line WLm, wherein n is not less than 17 and m is not more than 15.

17. The operation method according to claim 16, wherein the third pass voltage includes a set of voltage values different from the first pass voltage and the second pass voltage.

18. A memory system, comprising:
a memory device, comprising:
a memory array, the memory array comprises a plurality of memory blocks, each memory block includes a plurality of memory cell strings, and each memory cell string includes a top dummy cell, a plurality of memory cells, and a bottom dummy cell connected in series, wherein the top dummy cell is connected to a bit line, the bottom dummy cell is connected to a source line, the bottom dummy cell is coupled with a bottom dummy word line, the plurality of memory cells are respectively coupled with a plurality of word lines, and the top dummy cell is coupled with a top dummy word line; and
a control circuit coupled to the memory array and used to control the memory array, wherein the control circuit is configured to:
determine a first average value of threshold voltages of the bottom dummy cells in an unused memory block;
determine a difference value between the first average value and a first reference value; and
based on the difference value, program the bottom dummy cells in the memory block to raise the first average value to a first threshold, such that a potential difference between an edge word line and an adjacent non-edge word line is reduced when programming a memory cell coupled to a selected non-edge word line, wherein the edge word line is at least one word line of the plurality of word lines which is adjacent to the source line, the non-edge word line is a word line of the plurality of word lines except for the edge word line, and the selected non-edge word line is not adjacent to the edge word line; and
a memory controller coupled to the memory device and configured to control the memory device.

19. The memory system according to claim 18, wherein the first reference value is a second average value of threshold voltages of top dummy cells in the memory block.

20. The memory system according to claim 18, wherein the control circuit is further configured to, when programming the memory cell coupled to the selected non-edge word line:
apply a first pass voltage to an edge word line of the plurality of word lines; and
apply a second pass voltage to a non-edge word line adjacent to the edge word line, wherein the first pass voltage is less than the second pass voltage.

* * * * *